(12) United States Patent
Kumar et al.

(10) Patent No.: US 12,438,038 B2
(45) Date of Patent: Oct. 7, 2025

(54) FORMING VIAS IN A SEMICONDUCTOR DEVICE

(71) Applicants: Tokyo Electron Limited, Tokyo (JP); IMEC VZW, Leuven (BE)

(72) Inventors: Kaushik Kumar, Hoegaarden (BE); Yannick Feurprier, Brussels (BE); Zsolt Tökei, Leuven (BE)

(73) Assignees: TOKYO ELECTRON LIMITED, Tokyo (JP); IMEC VZW, Leuven (BE)

( * ) Notice: Subject to any disclaimer, the term of this patent is extended or adjusted under 35 U.S.C. 154(b) by 866 days.

(21) Appl. No.: 17/223,876

(22) Filed: Apr. 6, 2021

(65) Prior Publication Data
US 2021/0313217 A1    Oct. 7, 2021

Related U.S. Application Data

(60) Provisional application No. 63/006,338, filed on Apr. 7, 2020.

(51) Int. Cl.
*H01L 21/768* (2006.01)
*H01L 23/522* (2006.01)
(Continued)

(52) U.S. Cl.
CPC .. *H01L 21/76816* (2013.01); *H01L 21/76897* (2013.01); *H01L 23/5226* (2013.01); *H01L 23/528* (2013.01); *H01L 23/53295* (2013.01)

(58) Field of Classification Search
CPC ........... H01L 21/7681; H01L 21/76816; H01L 21/76897; H01L 21/0332
See application file for complete search history.

(56) References Cited

U.S. PATENT DOCUMENTS 6,225,211 B1 * 5/2001 Tsui ............... H01L 21/7681
257/E21.507
6,331,479 B1 * 12/2001 Li ................. H01L 21/7681
438/618

(Continued)

OTHER PUBLICATIONS

Pal et al., "Supervia: Relieving Routing Congestion using Double-height Vias", Master of Science Project Report, Department of Electrical Engineering, University of Californica Los Angeles, 9 pages.

(Continued)

*Primary Examiner* — Daniel Luke
(74) *Attorney, Agent, or Firm* — Slater Matsil, LLP

(57) ABSTRACT

In certain embodiments, a method includes forming a first etch stop layer on a first metallization layer of a semiconductor substrate. The method further includes forming, prior to forming a second metallization layer over the first metallization layer, an opening in the first etch stop layer according to a supervia mask. The method further includes forming the second metallization layer over the first metallization layer and forming a second etch stop layer on the second metallization layer. The method further includes forming, prior to forming a third metallization layer over the second metallization layer, an opening in the second etch stop layer according to the supervia mask. The method further includes forming the third metallization layer over the second metallization layer and etching a supervia opening from the third metallization layer to the first metallization layer according to the supervia mask.

20 Claims, 15 Drawing Sheets

(51) Int. Cl.
    *H01L 23/528*     (2006.01)
    *H01L 23/532*     (2006.01)

(56) References Cited

U.S. PATENT DOCUMENTS

| | | | | |
|---|---|---|---|---|
| 6,339,027 | B1* | 1/2002 | Chok | H01L 21/76897 |
| | | | | 257/E21.507 |
| 6,400,030 | B1* | 6/2002 | Wang | H01L 21/76897 |
| | | | | 257/E21.507 |
| 7,056,787 | B2* | 6/2006 | Chang | H01L 23/5226 |
| | | | | 257/E21.582 |
| 9,245,792 | B2* | 1/2016 | Chen | H01L 21/02274 |
| 10,020,254 | B1* | 7/2018 | Bao | H01L 23/53228 |
| 10,020,255 | B1* | 7/2018 | Bao | H01L 21/76804 |
| 10,622,301 | B2* | 4/2020 | Xu | H01L 21/02186 |
| 10,978,388 | B2* | 4/2021 | Amanapu | H01L 23/5226 |
| 11,075,160 | B2* | 7/2021 | Park | H01L 21/76877 |
| 2020/0058585 | A1* | 2/2020 | Xu | H01L 21/76816 |
| 2020/0111736 | A1* | 4/2020 | Amanapu | H01L 23/5226 |
| 2020/0357692 | A1* | 11/2020 | Mignot | H01L 21/76816 |

OTHER PUBLICATIONS

Zsolt Tokei, "The SuperVia: a promising scaling booster for the (sub-)3nm technology node", Imec Magazine, Nov. 2, 2018, 24 pages.

* cited by examiner

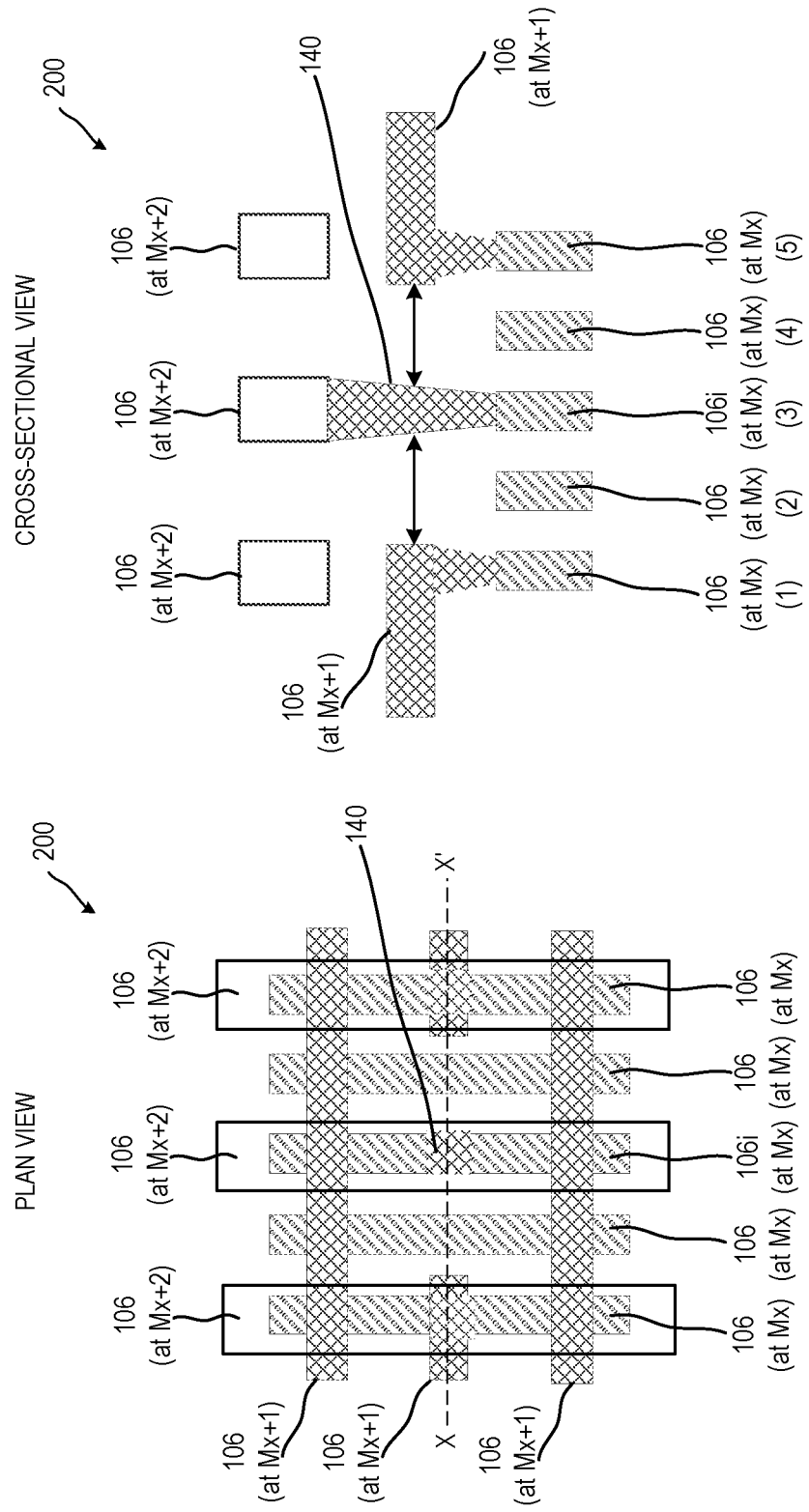

FORMING VIAS IN A SEMICONDUCTOR DEVICE

CROSS-REFERENCE TO RELATED APPLICATIONS

This application claims the benefit of U.S. Provisional Application No. 63/006,338, filed on Apr. 7, 2020, which is incorporated by reference.

TECHNICAL FIELD

This disclosure relates generally to semiconductor fabrication, and, in particular embodiments, to forming vias in a semiconductor device.

BACKGROUND

Generally, semiconductor devices, such as integrated circuits (ICs), are fabricated by sequentially depositing and patterning layers of dielectric, conductive, and semiconductor materials over a semiconductor substrate, using photolithography and etching to form structures that operate as circuit components (e.g., transistors, resistors, and capacitors) and as interconnect elements (e.g., conductive lines, contacts, and vias). The semiconductor industry has repeatedly reduced the minimum feature sizes in semiconductor devices to a few nanometers to increase the packing density of components, thereby reducing the cost of ICs.

This miniaturization to a few nanometers has intensified various challenges associated with semiconductor fabrication. Fabrication processes, including plasma and other processes, are expected to deliver precise dimensions (e.g., linewidths, etch depth, and film thicknesses) in the nanometer range along with precisely controlled features, for example, conformality, anisotropy, selectivity, surface and line edge roughness, and edge profile, often at atomic scale dimensions, uniformly across a wide (e.g., 300 mm) wafer.

Vias (also known as vertical interconnect access) are electrical connections between wiring layers in an IC. In a given circuit, transistor devices are formed on a plane. Typically above that plane, wiring levels are formed. These structures are generally elongated metal wires running in a horizontal direction (parallel to a wafer surface) with several layers of these wires separated by dielectric material. Vertical metal connections that connect wiring structures between horizontal layers are known as vias, and these are generally shorter in length compared to trenches or wires. Dual damascene is one process for metallization in which trenches and holes are formed in a dielectric material, and then these trenches and holes are simultaneously filled with a metal, which connects a given metal level to an adjacent metal level.

SUMMARY

In certain embodiments, a method of forming a vertical electrical interconnect includes forming a first metal layer on a substrate. The first metal layer has lines of metal running parallel to a working surface of the substrate with a dielectric material. The method includes forming a first metal-containing etch stop layer on the first metal layer and forming openings in the first metal-containing etch stop layer using a first supervia mask. The method further includes forming a second metal layer on the substrate over the first metal-containing etch stop layer, forming a second metal-containing etch stop layer on the second metal layer, and forming openings in the second metal-containing etch stop layer using the first supervia mask. The method further includes forming a third metal layer on the substrate over the second metal-containing etch stop layer and forming the first supervia mask over the substrate and etching a supervia opening from the third metal layer to the first metal layer.

In certain embodiments, a method includes forming a first metallization layer on a substrate. The first metallization layer includes a first metal feature and dielectric material. The method further includes forming a first metal-containing etch stop layer on the first metallization layer and forming, using a first patterned layer, an opening in the first metal-containing etch stop layer. The method further includes forming a second metallization layer on the substrate over the first metal-containing etch stop layer, forming a second metal-containing etch stop layer on the second metallization layer; and forming, using a second patterned layer, an opening in the second metal-containing etch stop layer. The method further includes forming a third metallization layer on the substrate over the second metal-containing etch stop layer and etching, using a third patterned layer, a supervia opening from the third metal layer to the first metal layer. The supervia opening extends through the opening in the second metal-containing etch stop layer and the opening in the first metal-containing etch stop layer.

In certain embodiments, a method includes forming a first etch stop layer on a first metallization layer of a semiconductor substrate. The method further includes forming, prior to forming a second metallization layer over the first metallization layer, an opening in the first etch stop layer according to a supervia mask. The method further includes forming the second metallization layer over the first metallization layer and forming a second etch stop layer on the second metallization layer. The method further includes forming, prior to forming a third metallization layer over the second metallization layer, an opening in the second etch stop layer according to the supervia mask. The method further includes forming the third metallization layer over the second metallization layer and etching a supervia opening from the third metallization layer to the first metallization layer according to the supervia mask.

Note that this summary section does not specify every embodiment and/or incrementally novel aspect of this disclosure. Instead, this summary only provides a preliminary description of certain embodiments and corresponding points of novelty over conventional techniques. For additional details and/or possible perspectives of this disclosure, the reader is directed to the Detailed Description of Illustrative Embodiments section and corresponding figures of this disclosure as further described below.

BRIEF DESCRIPTION OF THE DRAWINGS

For a more complete understanding of this disclosure, and advantages thereof, reference is now made to the following descriptions taken in conjunction with the accompanying drawings, in which:

FIG. 2 illustrates top and cross-sectional views of certain conductive features of an example semiconductor device, according to certain embodiments of this disclosure;

DETAILED DESCRIPTION OF ILLUSTRATIVE EMBODIMENTS

Figure 1A:
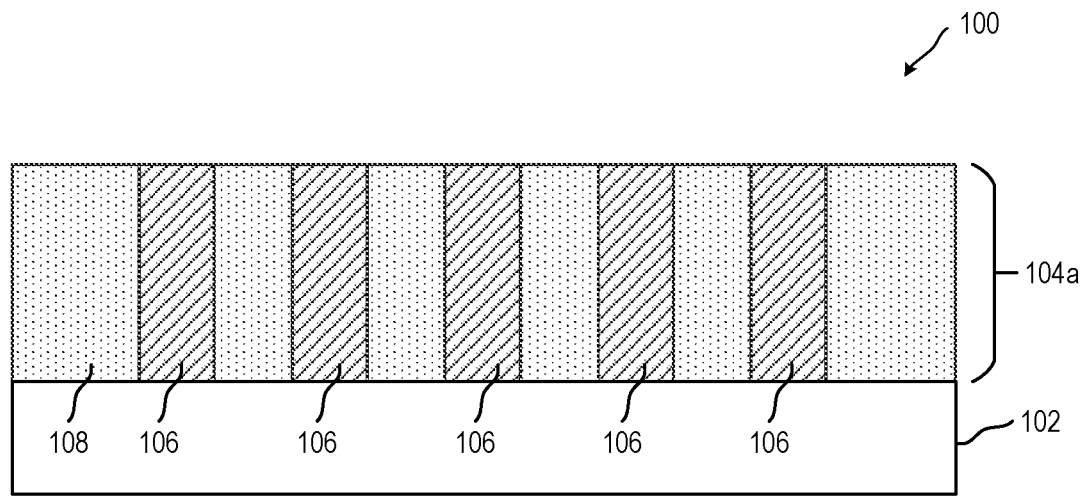
FIGS. 1A-1L illustrate cross-sectional views of an example semiconductor device during an example process for forming vias in the semiconductor device, according to certain embodiments of this disclosure.

Embodiments of this disclosure relate to forming vias in a semiconductor device. For example, certain embodiments provide techniques for forming vias that span multiple metal levels of a wiring structure and across buried etch stop layers of a semiconductor device. These vias are known as "supervias." That is, a supervia is a via that connects two metal layers that are separated by one or more intermediate metal layers. In other words, supervias may be vertical interconnects that connect non-adjacent metal levels.

The conductive wiring structure of a semiconductor device may be implemented in one or more metallization layers that overlay one or more electronic component layers. In certain embodiments, a metallization layer is a layer in which interconnections are made between layers of a semiconductor device positioned under the metallization layer (e.g., device layers and/or other metallization layers) and/or layers positioned over the metallization layer (e.g., device layers and/or other metallization layers). The electronic component (device) layers, for example, may implement one or more transistors, one or more diodes, one or more capacitors, one or more resistors, and/or other electronic components. The metallization layers, to which this description also may refer simply as metal layers, may be denoted using the convention M0 to Mn, with n being an integer greater than 0. For ease of description, M0 may refer to the metallization layer that is closest to the underlying electronic component layers, with each additional overlying metallization layer being referenced as M1, M2, M3, and so on. For purposes of this description, a metallization layer Mx may refer to any given metallization layer.

A supervia may be a homogenous via that connects multiple metallization layers. A supervia may connect from at least Mx+2 layer to an Mx layer. In other words, a supervia may connect from an Mx+i layer to an Mx layer, where both x and i are integers, x≥0, and i≥2. As just a few examples, a supervia may connect from M1 to M3, M1 to M4, M1 to M5, M5 to M7, and so on. Using supervias can help address reliability and/or resistance concerns.

Conventional vias that connect multiple levels of a wiring structure of a semiconductor device may include interfaces at each Mx+1 layer. The presence of interfaces in vertical interconnects can increase resistance in a semiconductor device. Additionally, increasing isolation dielectric may reduce capacitance but also may lead to a resistance penalty.

Supervias may provide a resistance reduction relative to these conventional vias that connect multiple levels of a wiring structure due, where supervias are used, at least in part to elimination of these interfaces for a given multi-level connection and/or the elimination of trench landing pads at Mx+1 layers. Furthermore, the elimination of trench landing pads at Mx+1 layers where supervias are used may provide capacitance benefits and routing decongestion.

In certain embodiments, supervias allow for design rule relaxation for tip-to-tip (t2t) and minimum metal area (minArea). For example, using a landing pad that is smaller may allow more supervias can be placed adjacent to routing.

A manufacturer may attempt to achieve certain goals in the design and implementation of supervias. Such goals may include, for example, self-alignment (using existing structures to help guide placement), acceptable/improved profile, loading, and a useable aspect ratio for the semiconductor device being designed. In some instances, these goals present competing interests.

During formation of the metallization layers of a semiconductor device, one or more etch stop layers may be formed. Material options for an etch stop layer might be driven by integration and reliability requirements. In some scenarios, the etch stop layer may serve as a diffusion barrier to copper (Cu), a moisture barrier to Cu, and an electromigration pinning layer for Cu. In certain embodiments, these etch-stop layers may be formed of a non-metal material (e.g., silicon carbon nitride (SiCN) or silicon nitride (SiN)) or a metal material (e.g., aluminum oxide (AlO) or aluminum nitride (AlN)), or another suitable material.

In some cases, using metal-containing material for one or more of the etch stop layers may provide certain advantages. For example, using a metal-containing material for the etch stop layers may allow the etch stop layers to be thinner relative to at least certain other non-metal-containing etch stop layers (e.g., SiCN or SiN etch stop layers). Using a thinner etch stop layer may allow more dielectric material, such as more low-k dielectric material, to be formed between and among conductive features of the semiconductor device (e.g., within a given metallization layer), which may provide certain performance advantages, particularly as device sizes continue to shrink. As a particular example, increased amounts of dielectric material, such as increased amounts of low-k material, may increase the possibility for fringe capacitance emitted from the conductive features within a metallization layer to remain within the dielectric material rather than being conducted by etch stop layers that tend to have higher dielectric constant.

Forming supervias when one or more metal-containing etch stop layers is used may present certain challenges. For example, etch chemistries that may be used to etch the dielectric material through which the via is being formed may be selective to a patterned layer (e.g., a hardmask) that is used to form the via (and potentially other features), such as a supervia. As a particular example, the patterned layer may be implemented as a metal-containing (e.g., titanium nitride (TiN)) hardmask, and avoiding unintended etching of this patterned layer may be desirable to facilitate self-alignment of the via.

On the other hand, etch chemistries that are capable of etching these metal-containing etch stop layers generally are not adequately selective to a patterned layer (e.g., a hardmask) that is used to form the via (and potentially other features), such as a supervia. For example, etching an AlO or AlN etch stop layer may use a corrosive etch scheme (e.g., involving chlorine or another suitable substance), which also may etch or weaken a metal hardmask. This remains true even if alternate dielectric films (e.g., hafnium oxide, or HfO2) that traditionally offer high selectivity towards etching are used. As a particular example, the patterned layer may be implemented as a metal-containing (e.g., TiN) hardmask that also unintentionally may be at least partially etched by the etch chemistry used to etch through the metal-containing etch stop layer when etching the via. As another particular example, a wet chemistry that may be used as part of a dual damascene process for etching a via (including forming an opening through an etch stop layer, whether metal-containing or otherwise) also may etch the hardmask layer. These difficulties may be exacerbated when forming a supervia that may involve etching through multiple metal-containing etch step layers, exposing the patterned layer (e.g., the TiN hardmask) to repeated instances of the etch chemistry and/or for an extended period of time.

Altering the profile and dimensions of the patterned layer, such as may result when attempting to etch through a metal-containing etch stop layer or otherwise using a chemistry that is not selective to the patterned layer, may have detrimental effects on the profile, dimensions, and alignment of the via that is formed using that patterned layer. As just one example, using an etch chemistry that deforms the patterned layer may disrupt the self-alignment of the via being etched. A resulting lithographic misalignment may increase resistance and reliability risks.

Additionally, even non-metal etch stop layers, such as SiCN or SiN etch stop layers, may present certain challenges. For example, etch chemistries for etching SiCN or SiN etch stop layers when forming a via may have poor selectivity to a dielectric material (e.g., a low-k dielectric material) through which the via is being formed, potentially resulting in undesirable etching of the dielectric material, disturbance of self-alignment of the via, and contortion of the via profile (e.g., bulging).

Certain embodiments of this disclosure provide techniques for forming multi-level vias, or supervias. In certain embodiments, a supervia etch mask (e.g., an Mx+2 or greater supervia etch mask) may be used to form openings in etch stop layers (to punch out the etch stop layers) at Mx and Mx+1 (and possibly others, depending on the span of the supervia) etch stop layers during formation of intermediate metallization layers. Certain embodiments may be used even with metal-containing etch stop layers, as the openings in the etch stop layers are formed prior to the presence of an overlying masking layer (hardmask) that might be damaged by the etch processes for etching the metal-containing etch stop layers.

FIGS. 1A-1L illustrate cross-sectional views of an example semiconductor device 100 during an example process for forming vias in semiconductor device 100, according to certain embodiments of this disclosure. Semiconductor device 100 is just one example of a structure that may be formed according to the disclosed techniques, and this disclosure contemplates forming any suitable semiconductor device. Semiconductor device 100 also could be referred to as a substrate.

As shown in FIG. 1A, semiconductor device 100 may include a substrate 102 and a metallization layer 104a formed over substrate 102.

Substrate 102 may include any suitable type of substrate. In certain embodiments, substrate includes one or more integrated circuit elements, such as one or more transistors, one or more diodes, one or more capacitors, one or more resistors, and/or other electronic components. These integrated circuit elements can have any suitable design, including any suitable planar or non-planar and two-dimensional or three-dimensional design.

Substrate 102 may include silicon (Si) or other suitable semiconductor materials. Furthermore, substrate 102 may include one or more metallization layers. In certain embodiments, substrate 102 includes at least one of an epitaxial layer, a single crystalline semiconductor material (e.g., Si, germanium (Ge), SiGe, indium gallium arsenide (InGaAs), GaAs, and/or other semiconductor materials), a silicon-on-insulator (SOI) structure, a wafer, or a die formed from a wafer. In certain embodiments, substrate 102 includes crystalline or polycrystalline silicon. Substrate 102 may be formed using any suitable semiconductor fabrication step or combination of semiconductor fabrication steps.

Metallization layer 104a includes conductive features 106 and dielectric material 108. Conductive features 106 may be or include metal, a metal alloy, or another conductive material. For purposes of this description, metal and metal alloy may be used interchangeably. In certain embodiments, the metal of conductive features 106 is or includes tungsten (W), Al, Cu, cobalt (Co), ruthenium (Ru), molybdenum (Mo), or another suitable material. In certain embodiments, the material of conductive features 106 includes a silicide material. In certain embodiments, conductive features 106 include multiple layers, such as a barrier layer, a seed layer, and a conductive fill layer.

Conductive features 106 may be any one or a combination of conductive vias, conductive lines, conductive contacts, or other conductive feature. In certain embodiments, a conductive feature 106 includes a line feature having, in a horizontal plane, a width (e.g., extending left and right on the page) and a length (e.g., extending into and out of the page), which may be greater than the width. In certain embodiments, a conductive feature 106 includes a via, for coupling other conductive elements of semiconductor device 100 for example. In certain embodiments, conductive features of metallization layer 104a run parallel to a working (e.g., top) surface of semiconductor device 100 at the stage illustrated in FIG. 1A with dielectric material 108.

Metallization layer 104a may be formed using any suitable semiconductor fabrication step or combination of semiconductor fabrication steps. In certain embodiments, metallization layer 104a may be formed at least in part using a damascene or dual damascene process. For example, conductive features 106 of metallization layer 104a may be formed using a damascene process that uses a patterned etch mask to etch a recess in the dielectric material 108 (described below) and filling the recess with a material of conductive features 106. In certain embodiments, the material of conductive features 106 overfills the recess and a planarization process is performed to remove portions that overfill the recess. A cap layer (e.g., of SiN, AlO, or another suitable material) also might be formed as part of conductive features 106.

For purposes of this example, metallization layer 104a may be considered the Mx layer of a to-be-formed supervia. Metallization layer 104a might or might not be the M0 layer of semiconductor device 100. Throughout the remainder of this description metallization layers of semiconductor device 100 may be referred to generally as metallization layers 104.

Dielectric material 108 may include any suitable type of dielectric material. In certain embodiments, dielectric material includes a low-k material. Low-k materials can have a k value of 2.5, 2.7, 3.0, and so forth. Dielectric material 108 may partially or wholly surround conductive features 106 of metallization layer 104a to partially or wholly electrically isolate conductive features 106 from one another. In certain embodiments, dielectric material 108 may be any material suitable for use as a pre-metal dielectric (PMD), an inter-metal dielectric (IMD), an interlayer dielectric (ILD), or the like.

Figure 1B:
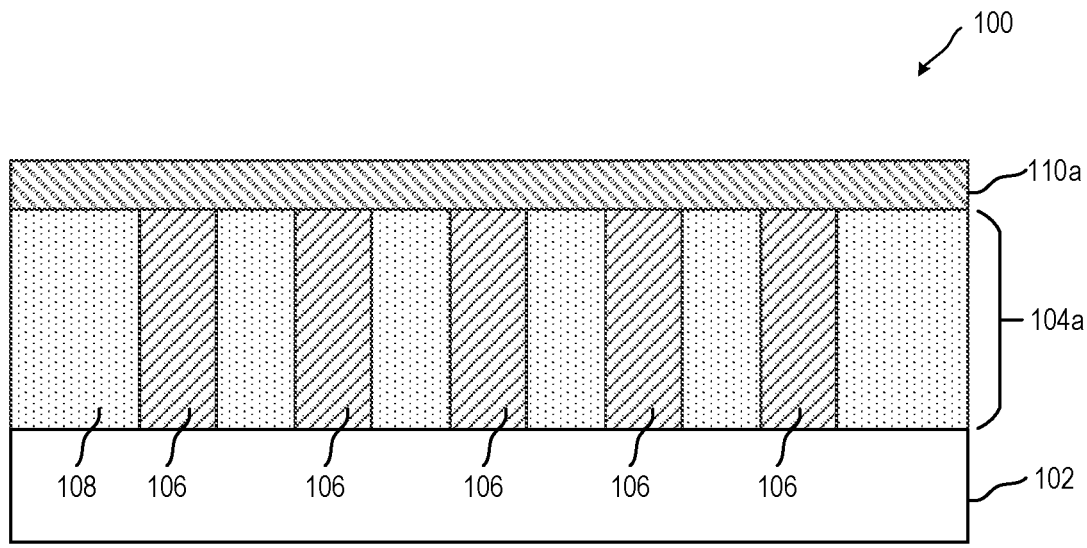

As shown in FIG. 1B, an etch stop layer 110a is formed on metallization layer 104a. Etch stop layer 110a may include any material or combination of materials suitable for forming an etch stop layer within the context of the device being formed. For example, etch stop layer 110a may be a non-metal-containing etch stop layer, being formed from SiCN or SiN as particular examples. As another example, etch stop layer 110a may be a metal-containing etch stop layer, being formed from AlO, AlN, or another suitable metal or combination of metals as particular examples. As described above, embodiments in which etch stop layer 110a is a metal-containing etch stop layer may present particular challenges in subsequent formation of a supervia in semiconductor device 100. Etch stop layer 110a may be formed using any suitable semiconductor fabrication step or combination of semiconductor fabrication steps. Throughout this description, without limitation a given etch stop layer 110 might or might not be considered part of an adjacent metallization layer 104.

Figure 1C:
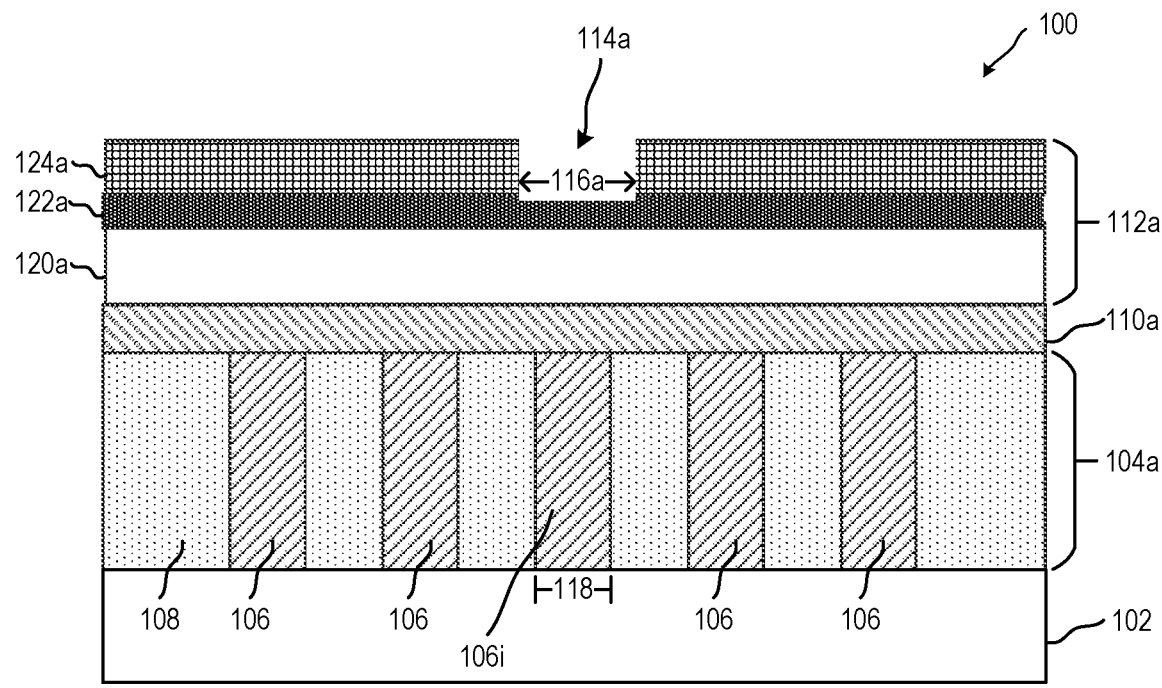
Figure 1D:
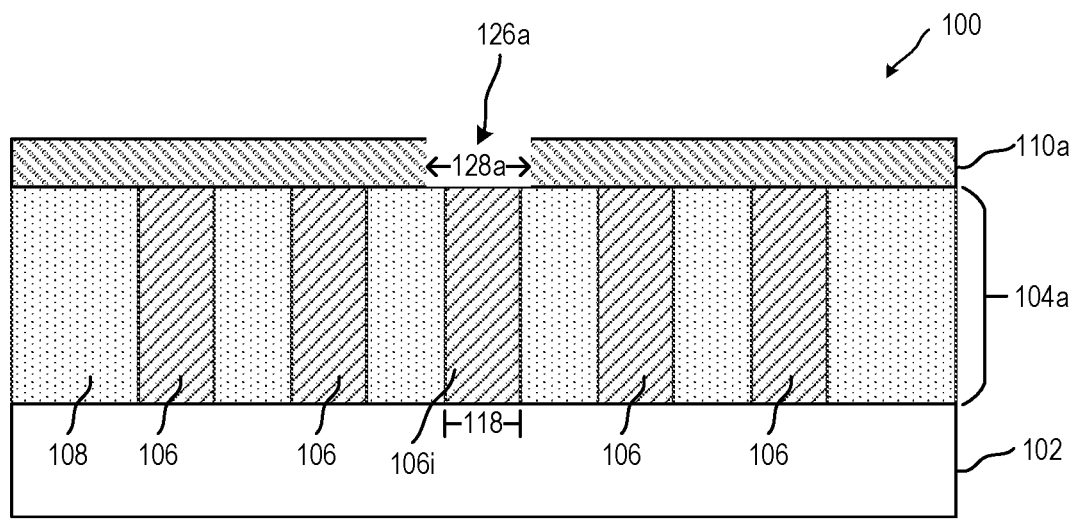

FIGS. 1C-1D illustrate a process for pre-forming an opening in etch stop layer 110a that will be part of a later-formed supervia opening for forming a supervia in semiconductor device 100. This opening in etch stop layer 110a also may be referred to as a punch-out or punch-out area.

As shown in FIG. 1C, a patterned layer 112a may be formed over etch stop layer 110a. Patterned layer 112a defines a pattern for forming an opening in etch stop layer 110a. In the illustrated example, the pattern defined by patterned layer 112a includes opening 114a, which corresponds to a targeted location for forming an opening in etch stop layer 110a.

Opening 114a of patterned layer 112a has a width 116a. Additionally, a conductive feature 106 over which the supervia is being formed (e.g., conductive feature 106i in this example) may have a width 118. Width 116a of opening 114a might be greater than, equal to, or less than a width 118 of conductive feature 106i. Furthermore, opening 114a might or might not be perfectly centered over conductive feature 106i. While in certain embodiments, it may be a goal for width 116a and width 118 to match as closely as possible and for opening 114a to be as perfectly centered over conductive feature 106i as possible, some tolerance is acceptable, particularly in light of the etch selectivity provided in an etch process for etching a supervia opening in a subsequent stage (e.g., as discussed below with reference to FIG. 1K) relative to a metal-containing etch stop layer 110a.

In certain embodiment, a supervia etch mask may be defined for semiconductor device 100, and that supervia etch mask may be used at a later processing stage for defining a supervia in semiconductor device 100. In certain embodiments, patterned layer 112a may be at least partially the same as the supervia etch mask. In one example, patterned layer 112a is the same as the supervia etch mask. Thus, as described in connection with forming openings in etch stop layers (e.g., etch stop layer 110a and other etch stop layers 110, whether etch stop layer 110b or the like) of semiconductor device 100, the supervia etch mask may be repeatedly used as a patterned layer (e.g., patterned layer 112a, 112b, and so on) such that a substantially aligned path through openings 126 in etch stop layers 110 for forming a supervia in semiconductor device 100 is formed.

Patterned layer 112a may be a photoresist etch mask. Patterned layer 112a may be implemented using one or more layers. In certain embodiments, patterned layer 112a is implemented as a tri-layer lithography stack. As a particular example of a tri-layer lithography stack, patterned layer 112a may include a hardmask layer 120a, a cover layer 122a formed on hardmask layer 120a, and a photoresist layer 124a formed on cover layer 122a. In one example, hardmask layer 120a includes spin-on carbon (SOC) or materials such as amorphous carbon formed using chemical vapor deposition (CVD), and cover layer 122a includes spin-on glass (SOG) or materials formed using CVD such as silicon oxynitride ($SiO_xN_y$), silicon dioxide, silicon carbide, and metal oxide. Although this particular patterned layer 112a is illustrated and described, patterned layer 112a may be implemented in any suitable manner.

In certain embodiments, patterned layer 112a is generally patterned using a photolithography process. As just one example, photoresist layer 124a may be exposed to a pattern of actinic radiation using a photolithography system, and after exposure, a relief pattern may be developed using a solvent that removes a portion of photoresist layer 124a to form opening 114 in photoresist layer 124a (and potentially extending into cover layer 122a or even hardmask layer 120a).

As shown in FIG. 1D, opening 126a is formed in etch stop layer 110a using patterned layer 112a as an etch mask. For example, using patterned layer 112a as an etch mask, a suitable etch process may be used to etch opening 126a in etch stop layer 110a. The pattern of patterned layer 112a, including for example opening 114a in patterned layer 112a, may facilitate etching opening 126a in etch stop layer 110a using a suitable etch process. Opening 126a also could be referred to as a punch-out or punch-out area. For example, opening 126a in etch stop layer 110a could be referred to as punch-out area one, or PA1.

The pattern defined by patterned layer 112a positions opening 114a of patterned layer 112a at a location corresponding to where a to-be formed supervia is desired. For example, patterned layer 112a may be the same as a supervia etch mask (to be used at a later stage when forming the supervia opening) such that opening 114a defined by patterned layer 112a and the resulting opening 126a in etch stop layer 110a are substantially aligned with a later-formed supervia opening defined by the supervia etch mask.

This disclosure contemplates using any suitable type of etch process(es) to form opening 126a in etch stop layer 110a using patterned layer 112a as an etch mask.

Opening 126a in etch stop layer 110a may expose a path for the to-be formed supervia to a conductive feature 106 (e.g., identified as conductive feature 106i) of metallization layer 104a. The critical dimension (CD) of opening 126a, shown as width 128a, may benefit from being the same as or similar to a contacting line CD at Mx (e.g., width 118 of conductive feature 106i). This also may help self-align subsequently-formed supervia at the Mx level.

Figure 1E:
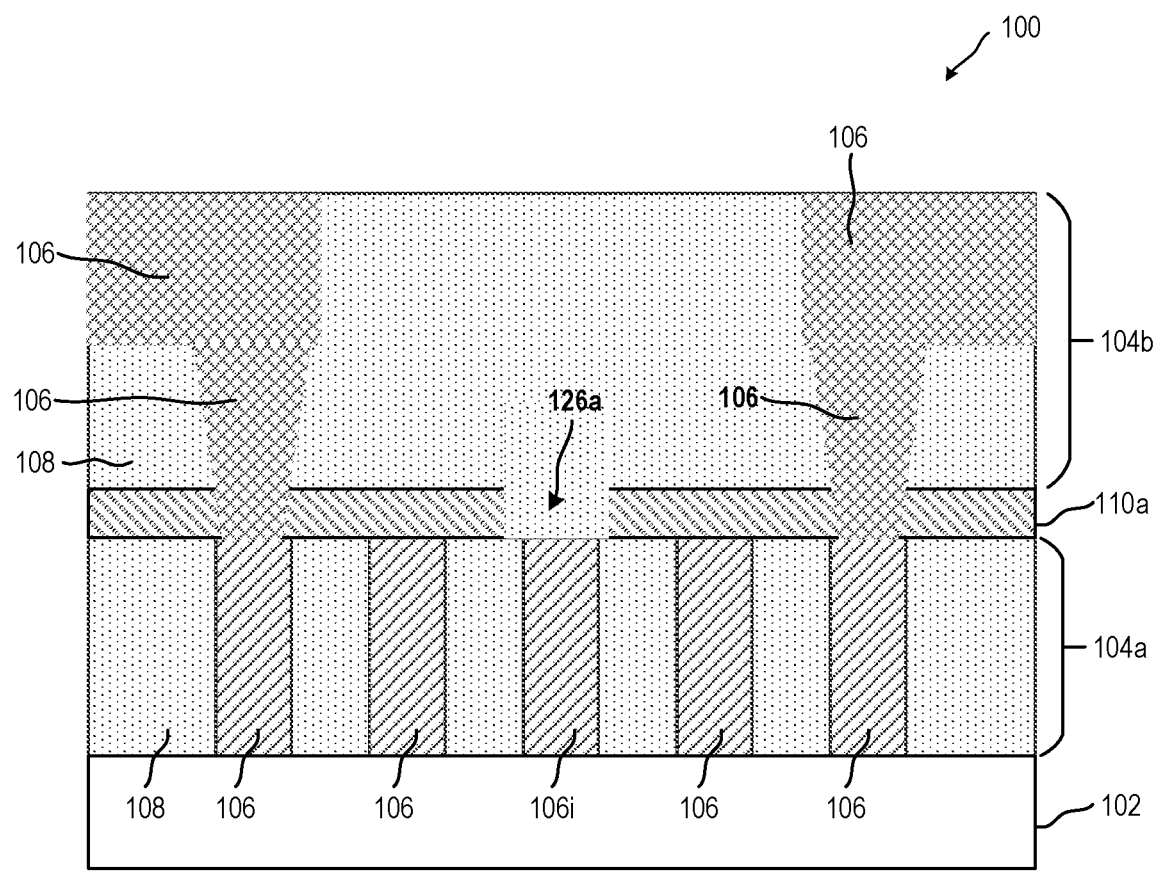

As shown in FIG. 1E, metallization of semiconductor device 100 continues with formation of metallization layer 104b. In this example, metallization layer 104b may be considered an Mx+1 layer. Metallization layer 104b includes conductive features 106 and dielectric material 108. Conductive features 106 of metallization layer 104b can include, for example, metal lines and vias, which connect Mx+1 to Mx. However, as described above, conductive features 106 may be any one or a combination of conductive vias, conductive lines, conductive contact, or other conductive feature. The description of conductive features 106 provided above with reference to FIG. 1A is incorporated by reference.

Metallization layer 104b may be formed using any suitable semiconductor fabrication step or combination of semiconductor fabrication steps. In certain embodiments, metallization layer 104b may be formed at least in part using a damascene or dual damascene process. For example, conductive features 106 of metallization layer 104b may be formed using a damascene process that uses a patterned etch mask to etch a recess in the dielectric material 108 of metallization layer 104b and filling the recess with a material of conductive features 106. In certain embodiments, the material of conductive features 106 overfills the recess and a planarization process is performed to remove portions that overfill the recess. If appropriate, a cap layer (e.g., of SiN, AlO, or another suitable material) also might be formed as part of conductive features 106.

Dielectric material 108 may include any suitable type of dielectric material. In certain embodiments, dielectric material includes a low-k material. Low-k materials can have a k value of 2.5, 2.7, 3.0, and so forth. Dielectric material 108 may partially or wholly surround conductive features 106 of metallization layer 104a to partially or wholly electrically isolate conductive features 106 from one another. In certain embodiments, dielectric material 108 may be any material suitable for use as a PMD, an IMD, an ILD, or the like.

Figure 1F:
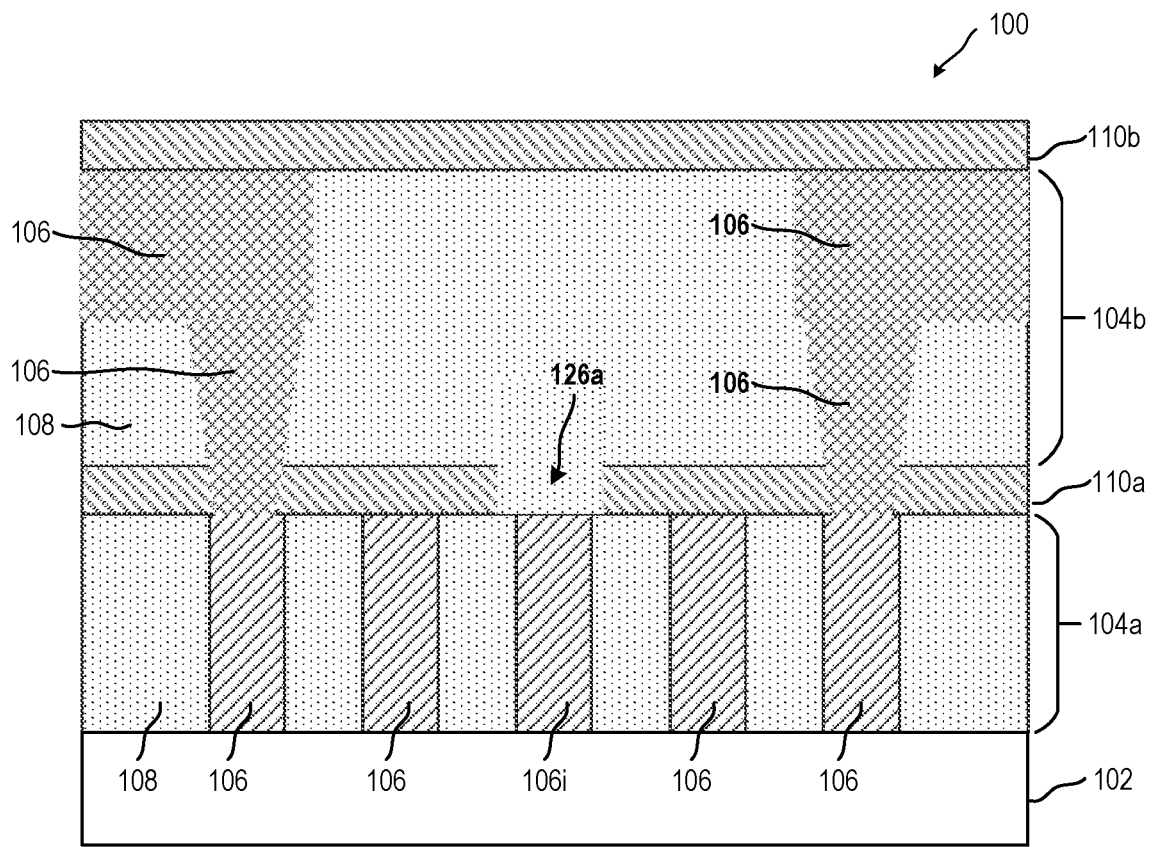

As shown in FIG. 1F, an etch stop layer 110b is formed on metallization layer 104b. Etch stop layer 110b may be include any material or combination of materials suitable for forming an etch stop layer within the context of the device being formed. For example, etch stop layer 110b may be a non-metal-containing etch stop layer, being formed from SiCN or SiN as particular examples. As another example, etch stop layer 110b may be a metal-containing etch stop layer, being formed from AlO, AlN, or another suitable metal or combination of metals as particular examples. Etch stop layer 110b may be made of the same material as or a different material than etch stop layer 110a, as may be appropriate for particular implementations. As described above, embodiments in which etch stop layer 110b is a metal-containing etch stop layer may present particular challenges in subsequent formation of a supervia in semiconductor device 100.

Etch stop layer 110b may be formed using any suitable semiconductor fabrication step or combination of semiconductor fabrication steps. In this example, etch stop layer no is an etch stop layer formed on Mx+1. Etch stop layer 110b may be made of the same material as or a different material than etch stop layer 110a, as may be appropriate for particular implementations.

Figure 1G:
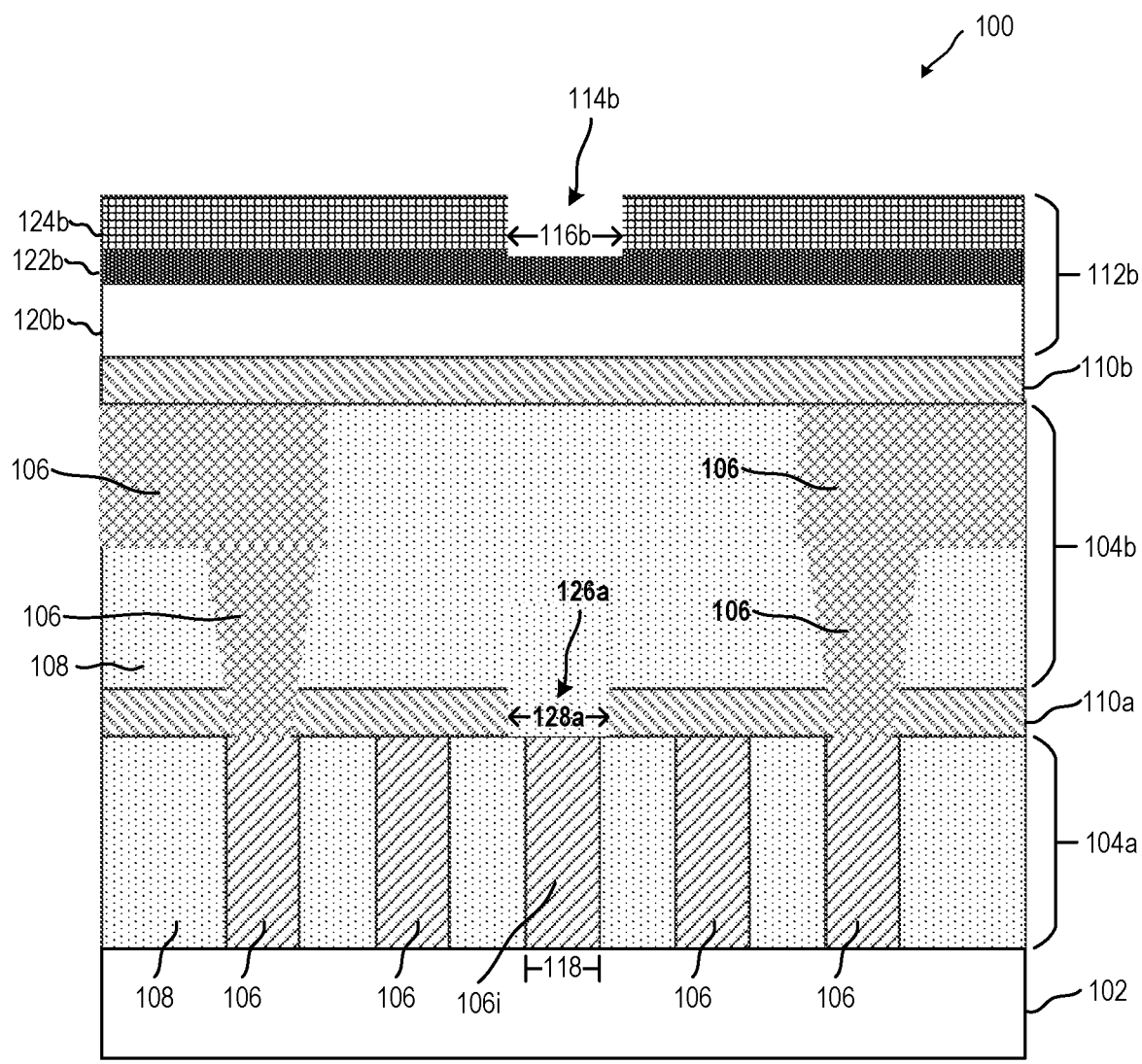
Figure 1H:
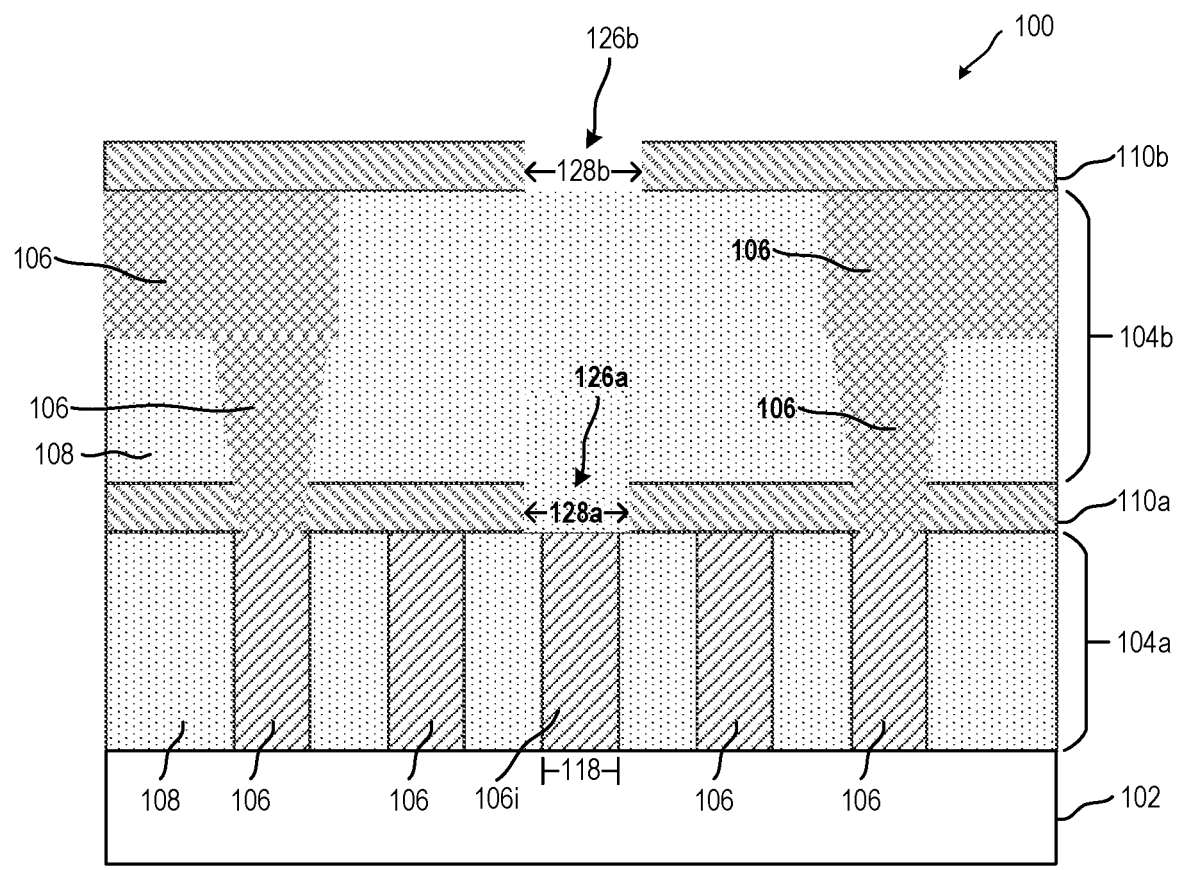

FIGS. 1G-1H illustrate a process for pre-forming an opening in etch stop layer 110b that will be part of a later-formed supervia opening for forming a supervia in semiconductor device 100. As described above with reference to opening 126a in etch stop layer 110a, this opening in etch stop layer 110b (to be referenced as opening 126b in FIG. 1H, with opening 126b having width 128b) also may be referred to as a punch-out or punch-out area.

As shown in FIG. 1G, a patterned layer 112b may be formed over etch stop layer 110b. Patterned layer 112b defines a pattern for forming an opening in etch stop layer 110b. In the illustrated example, the pattern defined by patterned layer 112b includes opening 114b, which corresponds to a targeted location for forming an opening in etch stop layer 110b.

Opening 114b of patterned layer 112b has a width 116b. In certain embodiments, width 116b of opening 114b is approximately the same as width 116a of opening 114a of patterned layer 112a. Additionally, a conductive feature 106 over which the supervia is being formed (e.g., conductive feature 106i in this example) may have a width 118. Width 116b of opening 114b might be greater than, equal to, or less than a width 118 of conductive feature 106i. Furthermore, opening 114b might or might not be perfectly centered over conductive feature 106i. While in certain embodiments, it may be a goal for width 116b and width 118 to match as closely as possible and for opening 114b to be as perfectly centered over conductive feature 106i as possible, some tolerance is acceptable, particularly in light of the etch selectivity provided in an etch process for etching a supervia opening in a subsequent stage (e.g., as discussed below with reference to FIG. 1K) relative to a metal-containing etch stop layer 110a.

In certain embodiments, patterned layer 112b is the same as patterned layer 112a, both of which may be the same as a supervia etch mask to be used in a later process for forming a supervia in semiconductor device 100.

In certain embodiment, a supervia etch mask may be defined for semiconductor device 100, and that supervia etch mask may be used at a later processing stage for defining a supervia in semiconductor device 100. In certain embodiments, one or more of patterned layers 112 (e.g., one or more of patterned layers 112a, 112b, and so on) may be at least partially the same as the supervia etch mask. In one example, patterned layer 112b is the same as the supervia etch mask. Thus, as described in connection with forming openings (e.g., openings 114a, 114b, and so on) in etch stop layers (e.g., etch stop layer 110, 110b, and so on) of semiconductor device 100, the supervia etch mask may be repeatedly used as a patterned layer (e.g., patterned layers 112a, 112b, and so on) such that a substantially aligned path through openings 126 for forming a supervia in semiconductor device 100 is formed.

Patterned layer 112b may be a photoresist etch mask. Patterned layer 112b may be implemented using one or more layers. In certain embodiments, patterned layer 112b may include a hardmask layer 120b, a cover layer 122b formed on hardmask layer 120b, and a photoresist layer 124b formed on cover layer 122b. In one example, hardmask layer 120b includes SOC or materials such as amorphous carbon formed using CVD, and cover layer 122b includes SOG or materials formed using CVD such as $SiO_xN_y$, silicon dioxide, silicon carbide, and metal oxide. Although this particular patterned layer 112b is illustrated and described, this disclosure contemplates patterned layer 112b being implemented in any suitable manner.

In certain embodiments, patterned layer 112b is generally patterned using a photolithography process. As just one example, photoresist layer 124b may be exposed to a pattern of actinic radiation using a photolithography system, and after exposure, a relief pattern may be developed using a solvent that removes a portion of photoresist layer 124b.

As shown in FIG. 1H, opening 126b is formed in etch stop layer 110b using patterned layer 112b as an etch mask. For example, using patterned layer 112b as an etch mask, a suitable etch process may be used to etch opening 126b in etch stop layer 110b. The pattern of patterned layer 112b, including for example opening 114b in patterned layer 112b, may facilitate etching opening 126b in etch stop layer 110b using a suitable etch process. Opening 126b also could be referred to as a punch-out or punch-out area. For example, opening 126b in etch stop layer 110b could be referred to as punch-out area two, or PA2.

The pattern defined by patterned layer 112b positions opening 114b at a location corresponding to where a to-be formed supervia is desired. For example, patterned layer 112b may be the same as a supervia etch mask (to be used at a later stage when forming the supervia opening) such that opening 114b defined by patterned layer 112b and the resulting opening 126b in etch stop layer 110b is substantially aligned with a supervia opening defined by the supervia etch mask.

This disclosure contemplates using any suitable type of etch process(es) to form opening 126b in etch stop layer 110b using patterned layer 112b as an etch mask.

Opening 126b in etch stop layer 110b may expose a path for the to-be formed supervia to a conductive feature 106 (e.g., identified as conductive feature 106i) of metallization layer 104b. The CD of opening 126b may benefit from being the same as or similar to a contacting line CD at Mx. This also may help self-align subsequently-formed supervia at the Mx level.

Figure 1I:
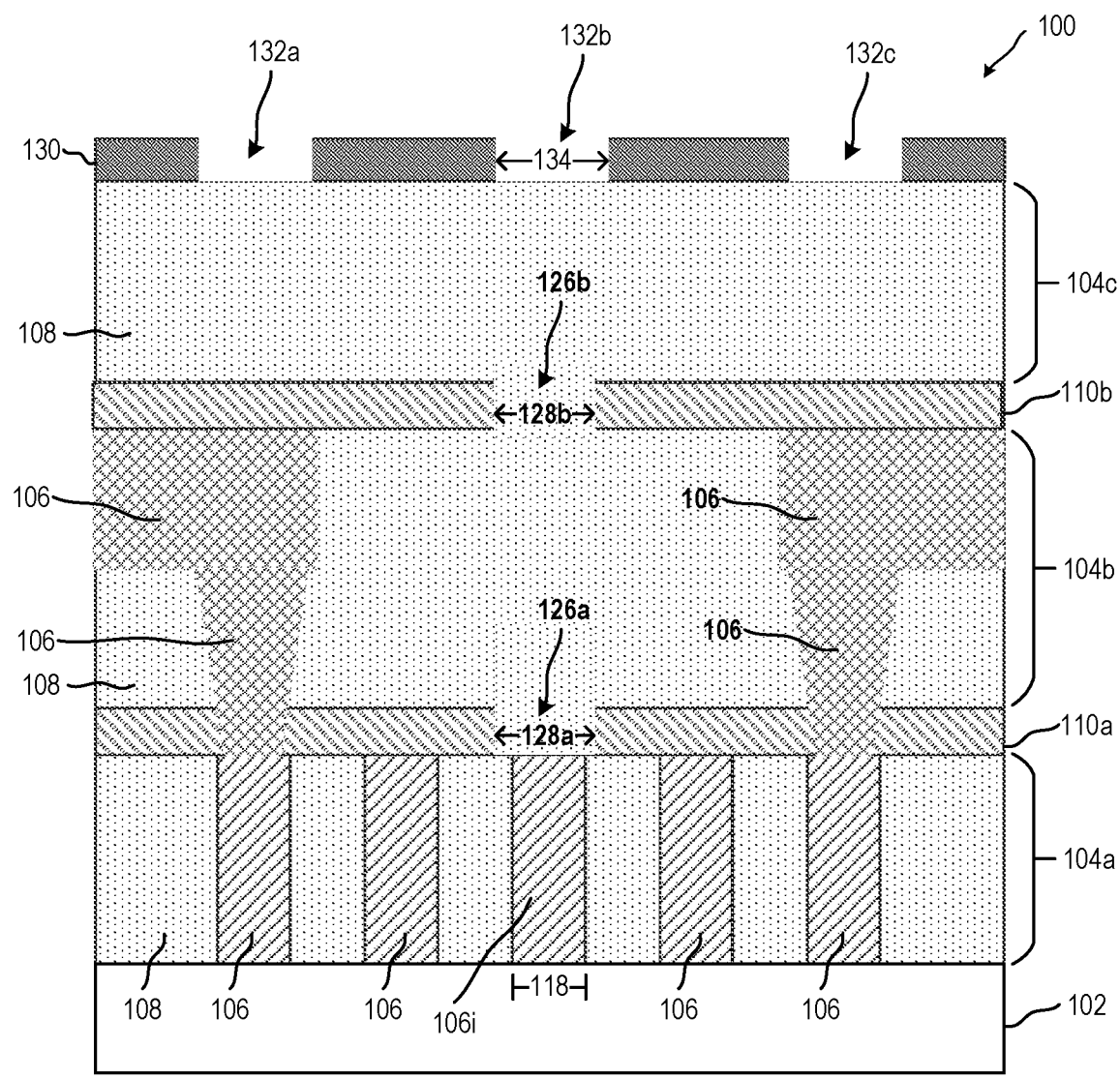

As shown in FIG. 1I, metallization of semiconductor device 100 continues with formation of metallization layer 104c. In this example, metallization layer 104c may be considered an Mx+2 layer. In the illustrated portion of metallization layer 104c, metallization layer 104c at this stage of processing includes dielectric material 108. Dielectric material 108 may include any suitable type of dielectric material. In certain embodiments, dielectric material includes a low-k material. Low-k materials can have a k value of 2.5, 2.7, 3.0, and so forth. Dielectric material 108 may partially or wholly surround conductive features 106 of metallization layer 104a to partially or wholly electrically isolate conductive features 106 from one another. In certain embodiments, dielectric material 108 may be any material suitable for use as a PMD, an IMD, an ILD, or the like.

The dielectric material 108 may be the same or different at each metallization layer 104. For example, metallization layer 104a may include a first dielectric material 108 while the dielectric material 108 of metallization layer 104b and/or metallization layer 104c may be different or the same as the first dielectric material 108. The same may be true for any additional metallization layers 104 that are implemented in a device according to certain embodiments of this disclosure.

Furthermore, as described above in connection with the deposition of dielectric material 108 on etch stop layer 110a as illustrated in FIG. 1E, opening 126b in etch stop layer 110b remains and dielectric material 108 deposited on etch stop layer 110b fills opening 114 in etch stop layer 110b.

As shown in FIG. 1I, a hardmask 130 is formed over metallization layer 104c. Although hardmask 130 may be formed of any suitable material, in one example hardmask 130 is a metal-containing hardmask. As just two examples, hardmask 130 may be a TiN hardmask or a tungsten-containing hardmask.

Hardmask 130 may be patterned to form openings in dielectric material 108 of third metallization layer 104c for conductive features in metallization layer 104c. For example, hardmask 130 may include openings 132a, 132b, and 132C (referred to generally as openings 132) to form trenches for conductive lines, conductive vias, conductive contacts, or other conductive features in metallization layer 104c. Hardmask 130 may be patterned in any suitable manner and using any suitable patterning techniques, including, as just one example, photolithography techniques. Among the openings 132 formed in hardmask 130 may be an opening 132b, which is at least partially formed in general alignment with opening 126b of etch stop layer 110b and opening 126a of etch stop layer 110a such that a supervia can be etched through at least a portion of opening 130b of hardmask 130.

Opening 132b of hardmask 130 has a width 134. In certain embodiments, width 134 of opening 132b of hardmask 130 is approximately the same as width 116b of opening 114b of patterned layer 112b and/or width 116a of opening 114a of patterned layer 112a. Additionally, a conductive feature 106 over which the supervia is being formed (e.g., conductive feature 106i in this example) may have a width 118. Width 134 of opening 132b might be greater than, equal to, or less than a width 118 of conductive feature 106i.

Furthermore, opening 132b might or might not be perfectly centered over conductive feature 106i. While in certain embodiments, it may be a goal for width 134 and width 118 to match as closely as possible and for opening 132b to be as perfectly centered over conductive feature 106i as possible, some tolerance is acceptable, particularly in light of the etch selectivity provided in an etch process for etching a supervia opening in a subsequent stage (e.g., as discussed below with reference to FIG. 1K) relative to a metal-containing etch stop layer 110a.

Figure 1J:
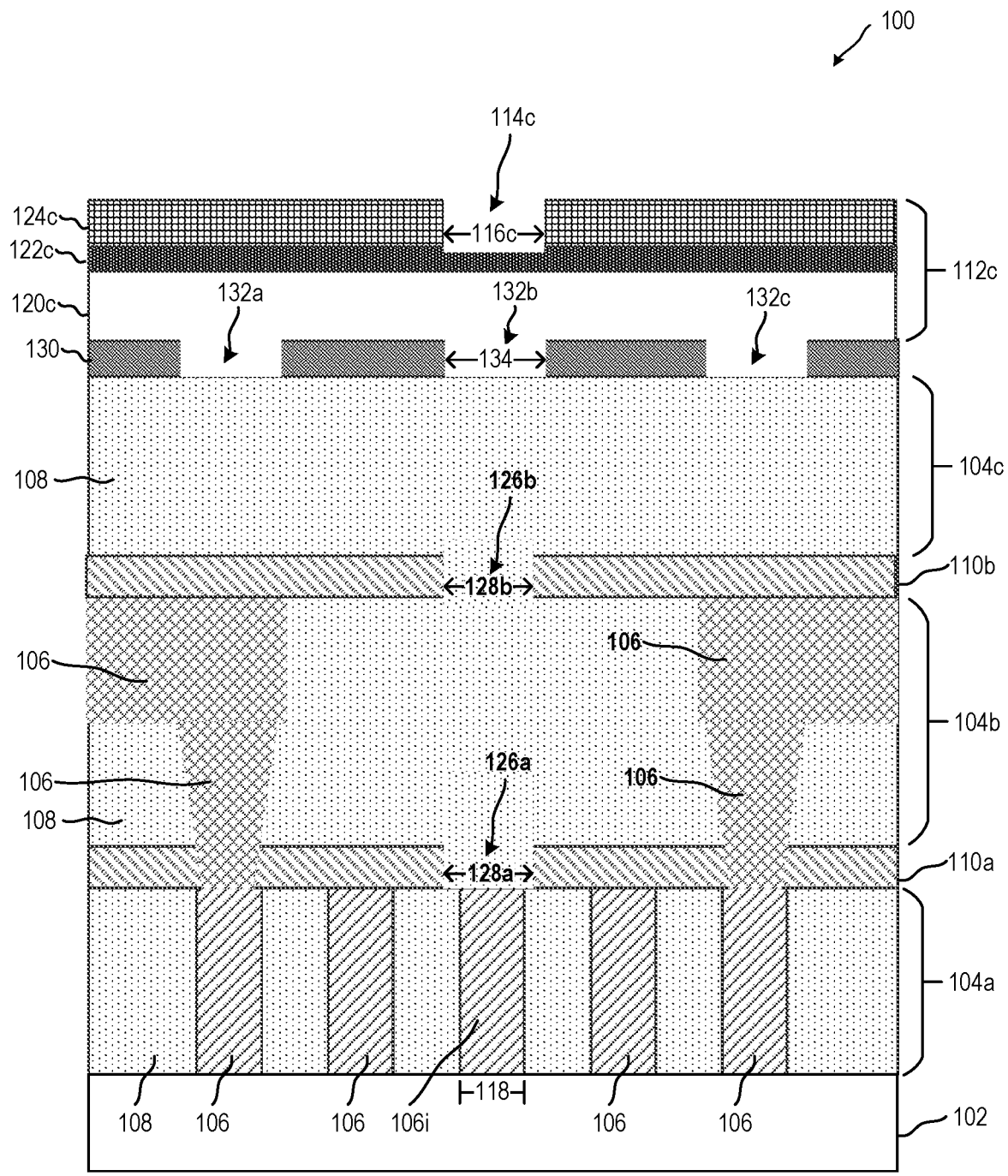

As shown in FIG. 1J, a patterned layer 112c may be formed over metallization layer 104c and hardmask 130. In the example illustrated in FIGS. 1A-1L, metallization layer 104c is the upper layer from which the to-be-formed supervia extend down to first metallization layer 104a. Thus, in this example, patterned layer 112c defines a pattern for forming a supervia opening. In the illustrated example, patterned layer 112c includes opening 114c, which corresponds to a targeted location for forming a supervia in semiconductor device 100.

In certain embodiment, a supervia etch mask may be defined for forming a supervia in semiconductor device 100, and, in this example, patterned layer 112c may serve as that supervia etch mask. In certain embodiments, patterned layer 112c may be at least partially the same as the previously-used patterned layer 112a (for forming opening 126a in etch stop layer 110a) and/or patterned layer 112b (for forming opening 126b in etch stop layer 110b). In one example, patterned layer 112c is the same as the previously-used patterned layer 112a and/or patterned layer 112b. Thus, the supervia etch mask may be repeatedly used as a patterned layer (e.g., patterned layers 112a, 112b, and so on) such that a substantially aligned path through openings 126 in etch stop layers 110 for forming a supervia in semiconductor device 100 is formed.

Opening 114c of patterned layer 112c has a width 116c. In certain embodiments, width 116c of opening 114c of patterned layer 112c is approximately the same as width 116a of opening 114a of patterned layer 112a and/or the width 116b of opening 114b of patterned layer 112b. Additionally, a conductive feature 106 over which the supervia is being formed (e.g., conductive feature 106i in this example) may have a width 118. Width 116c of opening 114c might be greater than, equal to, or less than a width 118 of conductive feature 106i. Furthermore, opening 114c might or might not be perfectly centered over conductive feature 106i. While in certain embodiments, it may be a goal for width 116c and width 118 to match as closely as possible and for opening 114c to be as perfectly centered over conductive feature 106i as possible, some tolerance is acceptable, particularly in light of the etch selectivity provided in an etch process for etching a supervia opening in a subsequent stage (e.g., as discussed below with reference to FIG. 1K) relative to a metal-containing etch stop layer 110a.

Patterned layer 112c may be a photoresist etch mask. Patterned layer 112c may be implemented using one or more layers. In certain embodiments, patterned layer 112c may include a hardmask layer 120c, a cover layer 122c formed on hardmask layer 120c, and a photoresist layer 124c formed on cover layer 122c. In one example, hardmask layer 120c includes SOC or materials such as amorphous carbon formed using CVD, and cover layer 122c includes SOG or materials formed using CVD such as $SiO_xN_y$, silicon dioxide, silicon carbide, and metal oxide. Although this particular patterned layer 112c is illustrated and described, this disclosure contemplates patterned layer 112c being implemented in any suitable manner.

In certain embodiments, patterned layer 112c is generally patterned using a photolithography process. For example, photoresist layer 124c may be exposed to a pattern of actinic radiation using a photolithography system, and after exposure, a relief pattern may be developed using a solvent that removes a portion of photoresist layer 124c.

Figure 1K:
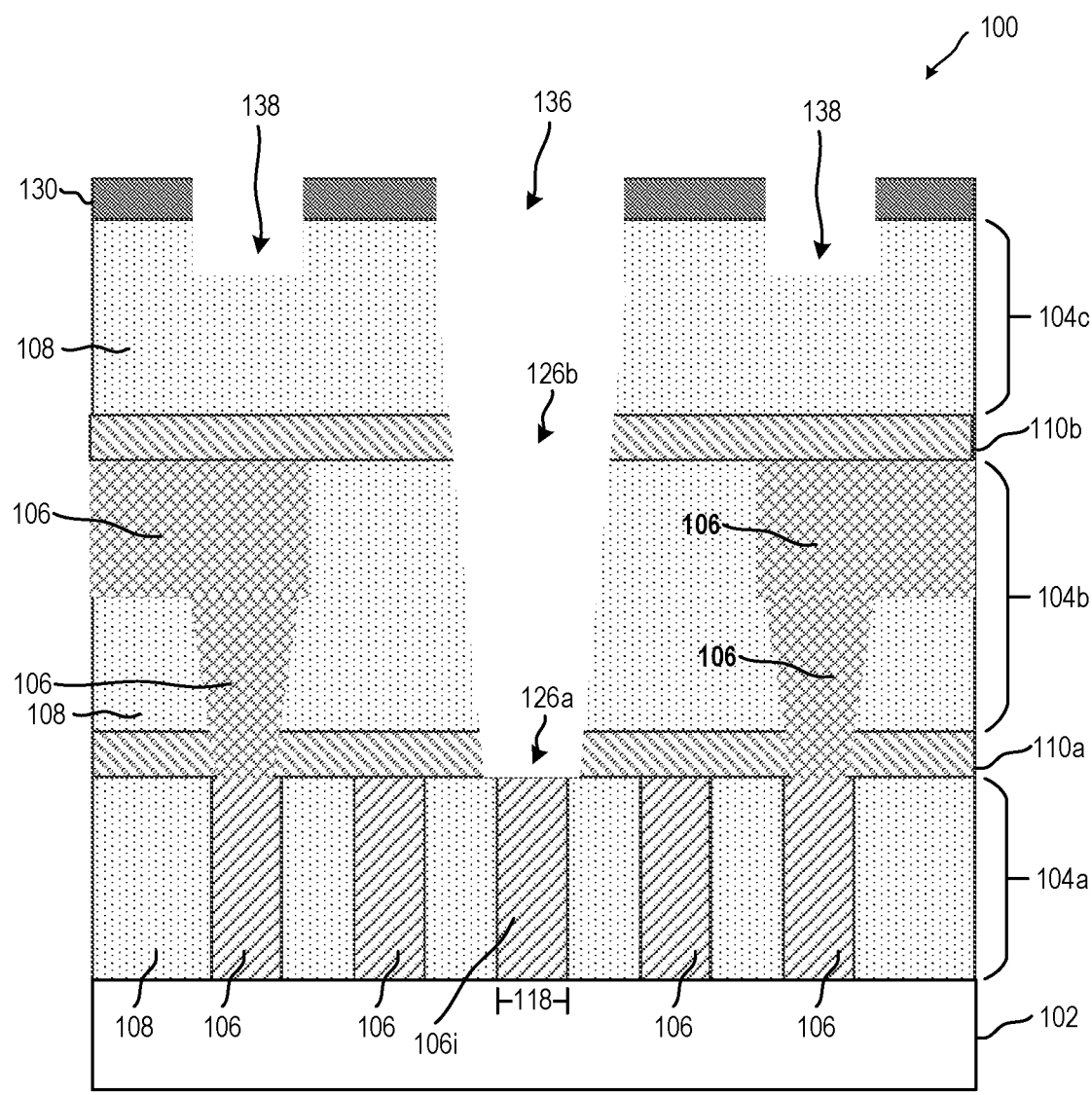

As shown in FIG. 1K, supervia opening 136 is formed using patterned layer 112c as an etch mask. For example, using patterned layer 112c as an etch mask, a suitable etch process (or combination of etch processes) may be performed to etch supervia opening 136 in semiconductor device 100. As a more particular example, using patterned layer 112c as an etch mask, a suitable etch process (or combination of etch processes) may be performed to etch supervia opening 136 from metallization layer 104c to metallization layer 104a, supervia opening 136 extending through opening 126b in etch stop layer 110b and opening 126a in etch stop layer 110a. The pattern of patterned layer 112c, including for example opening 114c in patterned layer 112c, may facilitate etching supervia opening 136 using a suitable etch process.

As described above, openings 126a and 126b (for the to-be-formed supervia) already have been formed in etch stop layers 110a and 110b, respectively. Using the same supervia mask for patterned layers 11a, 112b, and 112c, opening 114c is substantially aligned over openings 114b and 114a, as well as conductive feature 106i (Mx). The etch performed in associated with FIG. 1K removes dielectric material 108 down to the Mx level. In certain embodiments, a result of this etch is a self-aligned supervia opening 136 between Mx+2 and Mx. Hardmask 130 can then be used to etch openings 138 (e.g., trenches and single-layer vias) in metallization layer 104c (e.g., Mx+2).

This disclosure contemplates using any suitable type of etch process(es) to form supervia opening 136 using patterned layer 112c as an etch mask.

Supervia opening 136 may expose a path for the to-be formed supervia to a conductive feature 106 (e.g., identified as conductive feature 106i) of metallization layer 104a. The CD of opening 114c may benefit from being the same as or similar to a contacting line CD at Mx, which also may help self-align supervia opening 136 with conductive feature 106i at the Mx level. Furthermore, by forming openings 126 in etch stop layers 110, self-alignment of supervia opening 136 (and ultimately of a supervia formed in supervia opening 136) may be facilitated. Although this self-alignment may be present in any type of device that incorporates aspects of this disclosure, in embodiments in which etch stop layers 110 are metal etch stop layers, an etch process used to etch dielectric material 108 to form supervia opening 136 may be particularly selective to metal etch stop layers 110, which may further facilitate self-alignment of supervia opening 136. Furthermore, regardless of the type of etch stop layers 110 used, through CD control of openings 126 in etch stop layers 110, supervia opening 136 may self-align to conductive feature 106i at Mx for a partially or fully aligned supervia.

Figure 1L:
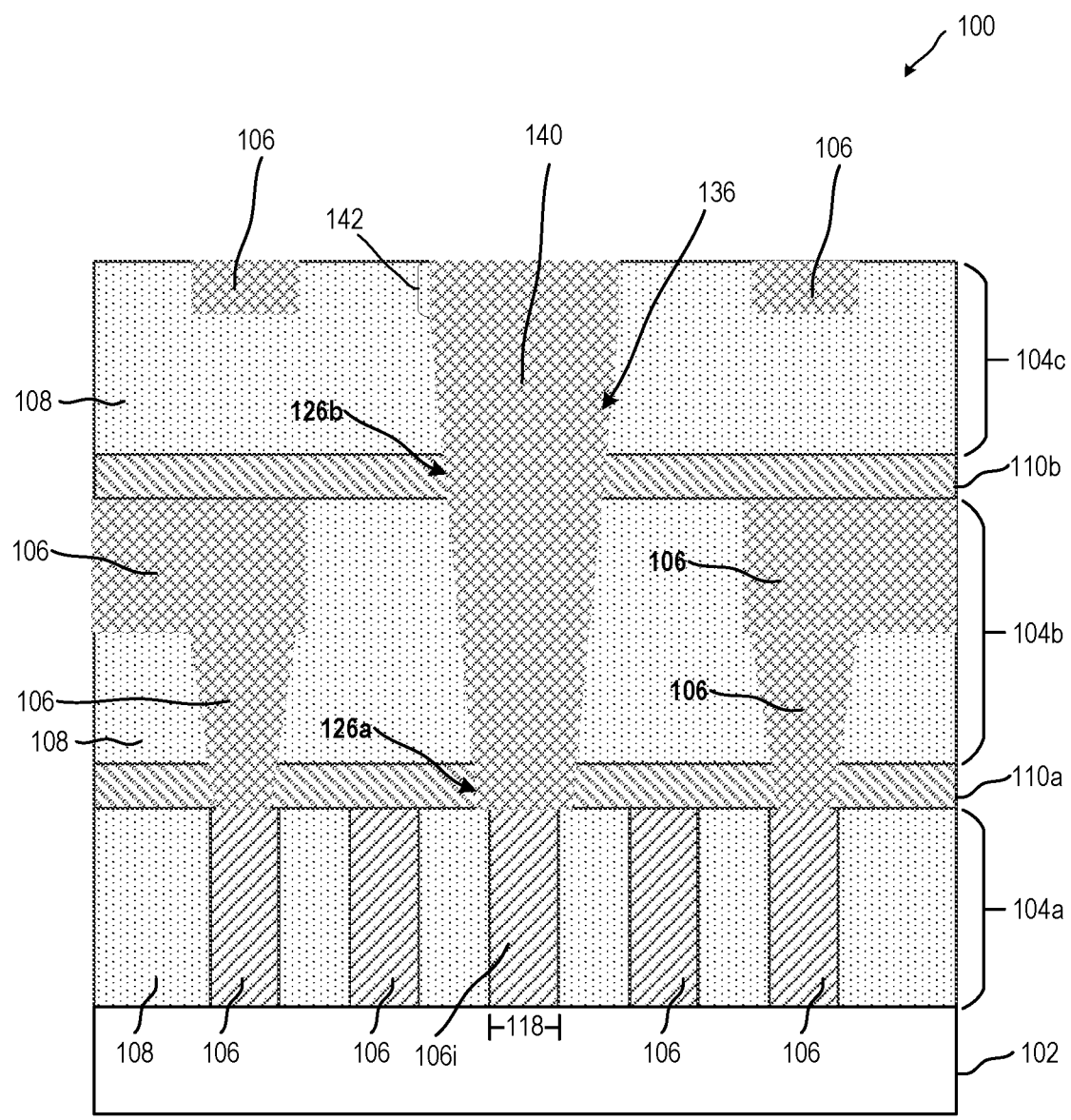

As shown in FIG. 1L, supervia opening 136 is filled with a conductive material to form supervia 140. This disclosure contemplates any suitable deposition process or combination of deposition processes to deposit conductive material in supervia opening 136 to form supervia 140. As just one example, a dual damascene process may be used to deposit conductive material in supervia opening 136 to form supervia 140. Supervia 140 passes from metallization layer 104c (Mx+2 in this example) through previously-formed openings 126b and 126a to contact conductive feature 106i of metallization layer 104a (Mx in this example).

Supervia 140 may be or include metal, a metal alloy, or another conductive material. In certain embodiments, the metal of supervia 140 is or includes W, Al, Cu, Co, Ru, Mo, or another suitable material. In certain embodiments, the material of supervia 140 includes a silicide material. In certain embodiments, supervia 140 includes multiple layers, such as a barrier layer, a seed layer, and a conductive fill layer. If desired, one or more intervening layers, such as one or more barrier layers may be deposited in supervia opening 136 prior to filling supervia opening 136 with the primary conductive material of supervia 140, and references to filling supervia opening 136 with a conductive material contemplate embodiments both with and without such intervening layers. Such intervening layers may include tantalum nitride (TaN), as just one example. Processing can continue with conventional dual damascene metallization to fill vias and trenches.

In certain embodiments, conductive features 106 may be formed in metallization layer 104c. For example, openings 138 formed using hardmask 130 as an etch mask may be etched and filled with a conductive material to form conductive features 106. Openings 138 may be filled as part of the same process for filling supervia opening 136 with conductive material to form supervia 140 or in a separate deposition process. In certain embodiments, an upper portion 142 of supervia 140 also may form at least a portion of a conductive feature (e.g., in addition to being part of or conductively coupled to supervia 140), such as a conductive line or a conductive contact, for example. In the case in which upper portion 142 of supervia 140 is a conductive line, upper portion 142 may run into and out of the page, which also may be true of other conductive features 106 of metallization layer 104c to the extent those conductive features 106 also form conductive lines. Conductive features 106 of metallization layer 104c may be filled in any suitable manner, such as any of the filling techniques described above with reference to forming other conductive features 106 and/or supervia 140.

In the illustrate example, at some point before, during, or after filling of supervia 140 and/or conductive features 106 of third metallization layer 104c, hardmask 130 may be removed using a suitable technique.

Throughout this description, reference to a deposition process may include a wet deposition process, a dry deposition process, any other suitable type of deposition process, or a combination of any suitable type of deposition processes. As just a few examples, a deposition process could include spin-on-coating, atomic layer deposition, CVD, and/or plasma-enhanced CVD (PCVD) (some of which may overlap in type). Furthermore, throughout this description, reference to an etch process may include a wet etch process, a dry etch process, any other suitable type of etch process, or a combination of any suitable type of etch processes. As just a few examples, an etch process could include a wet chemical etch, a plasma etch, and/or an atomic layer etch (some of which may overlap in type).

Although this description primarily references formation of a single supervia 140, it should be understood that multiple supervias 140 may be formed at the same time, at different times, or at partially overlapped times, as may be appropriate for a given application, and in association with forming each supervia 140, a corresponding set of openings 126 in etch stop layers 110 (the quantity of which will depend on the number of metallization layers 104 through which the supervia 140 is formed) may be formed. For example, across a three-dimensional wafer, multiple supervias 140 may be formed simultaneously. To that end, a patterned layer 112 may define multiple openings 114 that can be used to form multiple openings 126 in an etch stop layer 110 across a wafer.

Embodiments of this disclosure may provide one or more technical advantages. Embodiments may provide some, none, or all of these advantages. Additional advantages may be described throughout this disclosure.

In certain embodiments, techniques herein can form vias extending between two or more metallization layers 104. For supervias spanning more than two metallization layers 104, a given supervia mask (e.g., patterned layer 112) may be used to create punch-outs (openings 126) at each etch stop layer 110 used between a beginning and end of a particular supervia 140. A resulting supervia 140 may be formed without interfaces, which may reduce or eliminate resistance penalties.

Although embodiments of this disclosure can be used with any suitable type of etch stop layer no, certain embodiments allow the use of metal-containing etch stop layers 110 with improved preservation of other layers (e.g., a hardmask 130) when forming supervia 140 or another suitable type of structure. Therefore, certain embodiments allow the benefits of supervias (e.g., including, potentially, reduced resistance and/or improved reliability) to be provided even for semiconductor devices 100 that incorporate metal-containing etch stop layers 110. Thus, in certain embodiments, with the disclosed techniques for forming supervias, the choice of etch stop materials to be used in a process for forming such supervias is open to both metal-containing and non-metal containing materials.

In certain embodiments, using metal-containing etch stop layers 110 and forming openings 126 in metal-containing etch stop layers 110 for a to-be formed supervia 140 provides for self-alignment at each metallization layer 104 during the etch of the dielectric material 108 for forming supervia 140, as the etch process used for etching supervia 140 (by etching dielectric material 108) may be selective to metal (e.g., with little to no etching of the metal).

Certain embodiments use a supervia etch mask (e.g., patterned layer 112c) as a template after etch stop layer 110 deposition to create one or more openings 126 in etch stop layers 110 for forming self-aligned supervias 140.

In certain embodiments, even assuming that the photolithography scanner carries certain alignment tolerances of about 2 nm, as just one example, misalignment may still be manageable as the disclosed process may allow supervia 140 to self-align.

In certain embodiments, even if openings 126 formed in etch stop layers 110 differ from a final CD of a targeted conductive feature 106 (e.g., conductive feature 106i), the supervia 140 may still self-align. As just one example, larger CDs may be acceptable and traditional via shrinking might or might not be needed.

Certain embodiments allow for cryogenic etching. In certain embodiments, loading is not a significant issue. In certain embodiments, profile control of a supervia 140 and self-alignment of a supervia 140 may be part of the same etch.

Certain embodiments allow smaller device sizes and/or more densely-packed devices, as elements of metallization layers 104 may be positioned closer to one another with reduced concerns for current leakage. For example, certain embodiments may facilitate making both so-called five-track and three-track designs, as explained further below.

FIG. 2 illustrates top and cross-sectional views of certain conductive features of an example semiconductor device 200, according to certain embodiments of this disclosure. In other words, FIG. 2 primarily illustrates the metallization features of semiconductor device 200. The cross-sectional view is taken along line X-X' of the top view of semiconductor device 200. In general, semiconductor device 200 shares numerous features in common with semiconductor device 100 as shown in FIG. 1L.

In the illustrated example, at the illustrated portion of Mx, five adjacent conductive features 106 are included, with the identity of the feature shown in parentheses (e.g., 106 at Mx (1), 106 at Mx (2), and so on). As shown in the cross-sectional view of semiconductor device 200, conductive features 106 at Mx+1 are coupled to conductive features 106 (at Mx) (1) and 106 (at Mx) (5), and supervia 140 is coupled to conductive feature 106 (at Mx) (3). Thus, at the Mx metallization level, connections to upper metallization layers are separated by one conductive feature 106 at Mx, there being no upper-level connection to conductive feature 106 (at Mx) (2) and no upper-level connection to conductive feature 106 (at Mx) (4), at least in the particular illustrated cross section. This may be referred to as a five-track design. As shown by the bidirectional arrows at Mx+1 between conductive features 106 and supervia 140, sufficient separation exists at Mx+1 between conductive features 106 and supervia 140.

Figure 3:
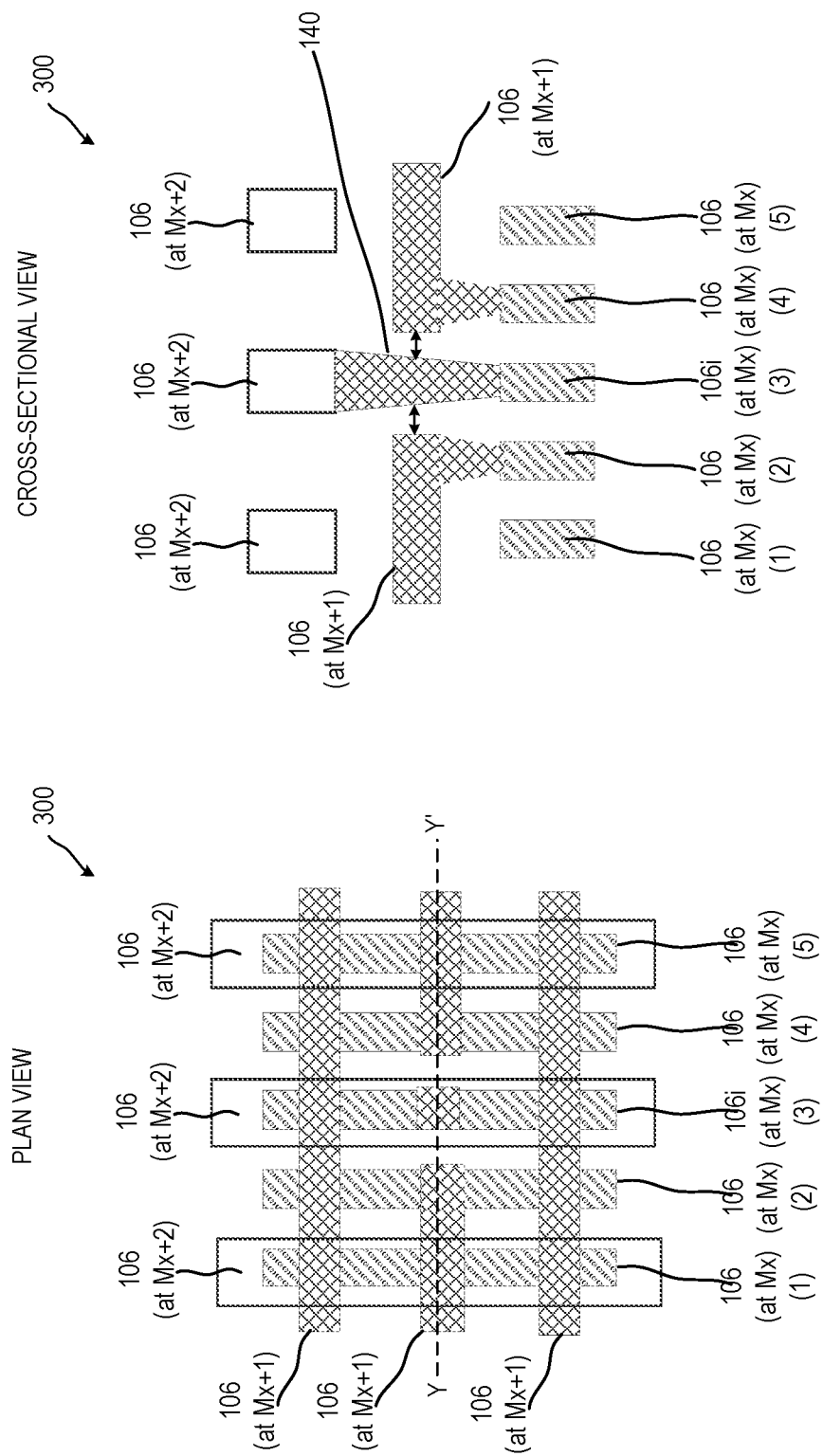
FIG. 3 illustrates top and cross-sectional views of certain conductive features of an example semiconductor device, according to certain embodiments of this disclosure.

FIG. 3 illustrates top and cross-sectional views of certain conductive features of an example semiconductor device 300, according to certain embodiments of this disclosure. In other words, FIG. 3 primarily illustrates the metallization features of semiconductor device 300. The cross-sectional view is taken along line Y-Y' of the top view of semiconductor device 300. In general, semiconductor device 300 shares numerous features in common with semiconductor device 100 as shown in FIG. 1L.

In the illustrated example, at the illustrated portion of Mx, five adjacent conductive features 106 are included, with the identity of the feature shown in parentheses (e.g., 106 at Mx (1), 106 at Mx (2), and so on). As shown in the cross-sectional view of semiconductor device 300, conductive features 106 at Mx+1 are coupled to conductive features 106 (at Mx) (2) and 106 at Mx (4), and supervia 140 is coupled to conductive feature 106 (at Mx) (3). Thus, at the Mx metallization level, connections to upper metallization layers are separated by no conductive feature 106 at Mx, as conductive features 106 (at Mx) (2), 106 (at Mx) (3), and 106 (at Mx) (4) are directly adjacent to one another at the Mx metallization level, at least in the particular illustrated cross section. This may be referred to as a three-track design.

As shown by the bidirectional arrows at Mx+1 between conductive features 106 and supervia 140, separation between conductive features 106 and supervia 140 at Mx+1 is smaller relative to semiconductor device 200. In certain embodiments, due at least in part to the potentially improved self-alignment of the supervia etch and reduction or elimination of interfaces in a supervia 140, coupled with the ability to use metal etch stop layers 110 (and thereby included additional dielectric material 108), such three-track designs may be possible with reduced risk of leakage/shorting between supervia 140 and adjacent conductive features 106. Making such three-track designs possible may also make such supervia structures viable for 5 nm nodes and beyond, as well as, of course, at higher node sizes. As such, embodiments of this disclosure, due at least part to the self-alignment herein, allows closer spacing of a supervia to nearby conductive lines with minimal or no increase in the risk of shorting.

Figure 4:
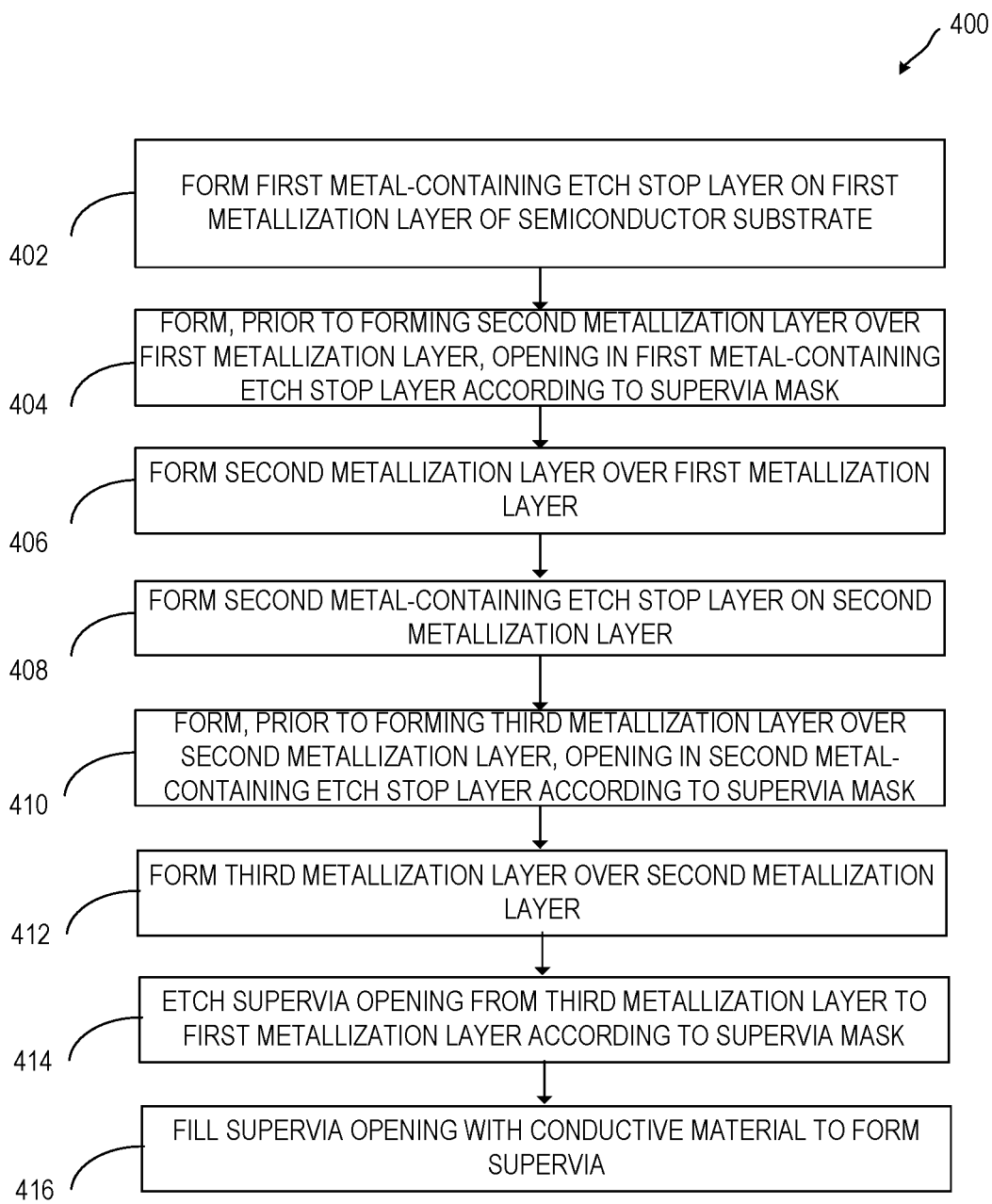
FIG. 4 illustrates an example method of for forming vias in the semiconductor device, according to certain embodiments of this disclosure.

FIG. 4 illustrates an example method 400 of for forming vias in the semiconductor device, according to certain embodiments of this disclosure. Although method 400 forms a supervia that connects an Mx layer to an Mx+2 layer, this disclosure contemplates method 400 incorporating additional layers for a supervia, if desired. Although method 400 is described with reference to forming a single supervia 140, one of skill in the art will understand that additional supervias could be formed, potentially simultaneously, using or as a part of the same process.

At step 402, an etch stop layer 110*a* is formed on a first metallization layer 104*a* of a substrate 102. In certain embodiments, etch stop layer 110*a* contains metal. Etch stop layer 110*a* may be formed of a non-metal material (e.g., SiCN or SiN) or a metal-containing material (e.g., AlO or AlN), or another suitable material. At step 404, prior to forming a second metallization layer 104*b* over first metallization layer 104*a*, opening 126*a* is formed in first etch stop layer 110*a* according to a patterned layer 112*a*. Forming opening 126*a* in etch stop layer 110*a* may include performing a wet etch process, a dry etch process, or a combination of a wet etch process and a dry etch process. In certain embodiments, patterned layer 112*a* is at least partially the same as a supervia mask to be used at a later stage to form a supervia opening for forming a supervia.

At step 406, second metallization layer 104*b* is formed over first metallization layer 104*a*. At step 408, an etch stop layer 110*b* is formed on second metallization layer 104*b*. In certain embodiments, etch stop layer 110*b* contains metal. Etch stop layer 110*b* may be formed of a non-metal material (e.g., SiCN or SiN) or a metal-containing material (e.g., AlO or AlN), or another suitable material. In certain embodiments, etch stop layer nob is made of the same material as etch stop layer 110*a*. At step 410, prior to forming a third metallization layer 104*c* over second metallization layer 104*b*, opening 126*b* is formed in etch stop layer nob according to a patterned layer 112*b*. Forming opening 126*b* in etch stop layer nob may include performing a wet etch process, a dry etch process, or a combination of a wet etch process and a dry etch process. In certain embodiments, patterned layer 112*b* is at least partially the same as a supervia mask to be used at a later stage to form a supervia opening for forming a supervia.

At step 412, third metallization layer 104*c* is formed over second metallization layer 104*b*. At step 414, supervia opening 136 is etched from third metallization layer 104*c* to first metallization layer 104*a* according to a patterned layer 112*c*. Etching supervia opening 136 may include performing a wet etch process, a dry etch process, or a combination of a wet etch process and a dry etch process. In certain embodiments, patterned layer 112*c* is a supervia mask for forming supervia opening 136 for forming a supervia. In certain embodiments, opening 126*a* in etch stop layer 110*a*, opening 126*b* in etch stop layer 110*b*, and an opening (opening 114*c*) in patterned layer 112*c* (e.g., the supervia mask) are at least partially vertically aligned. At step 416, supervia opening 136 is filled with a conductive material to form supervia 140.

Figure 5A:
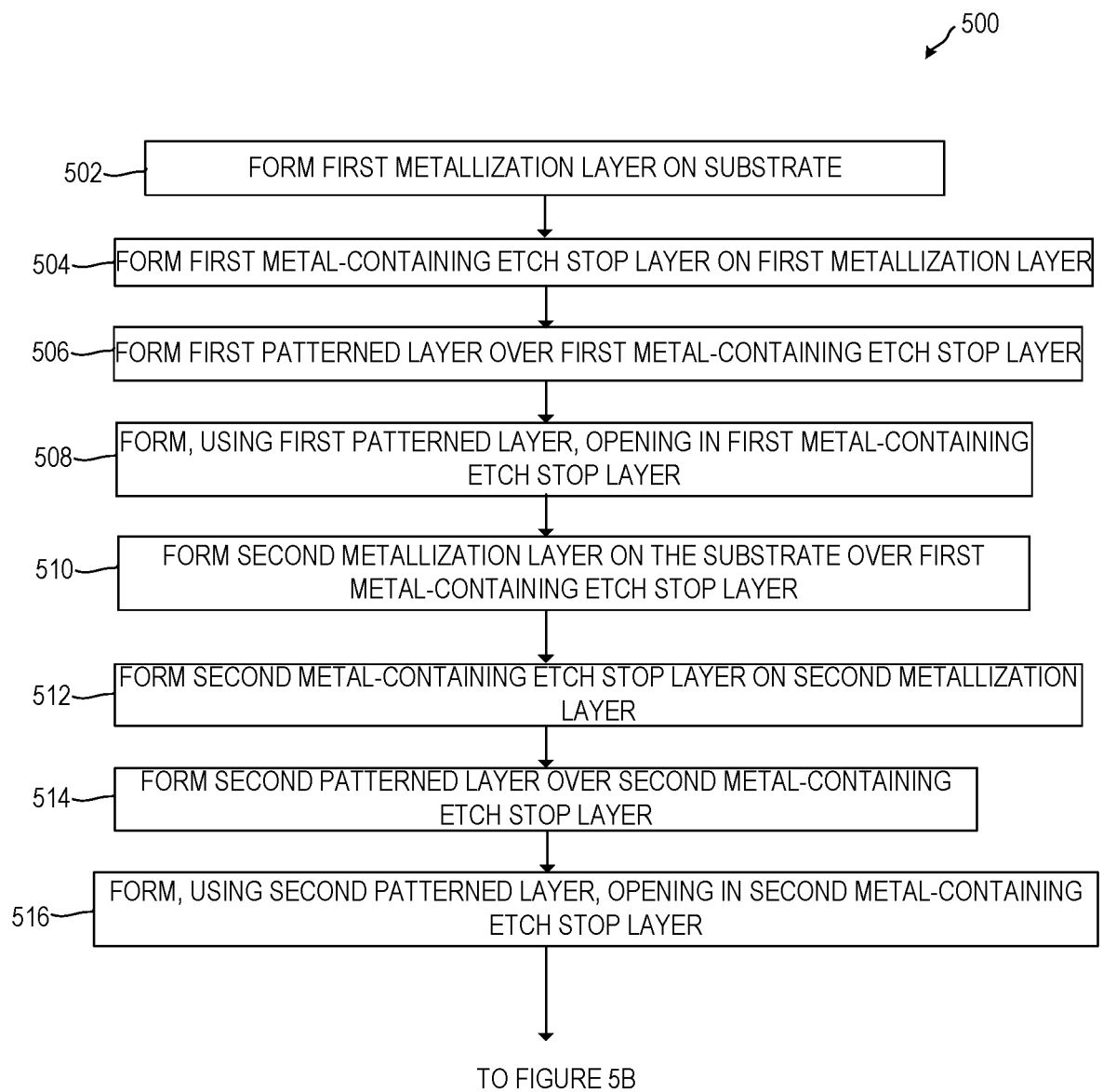
FIGS. 5A-5B illustrate an example method of for forming vias in the semiconductor device, according to certain embodiments of this disclosure.
Figure 5B:
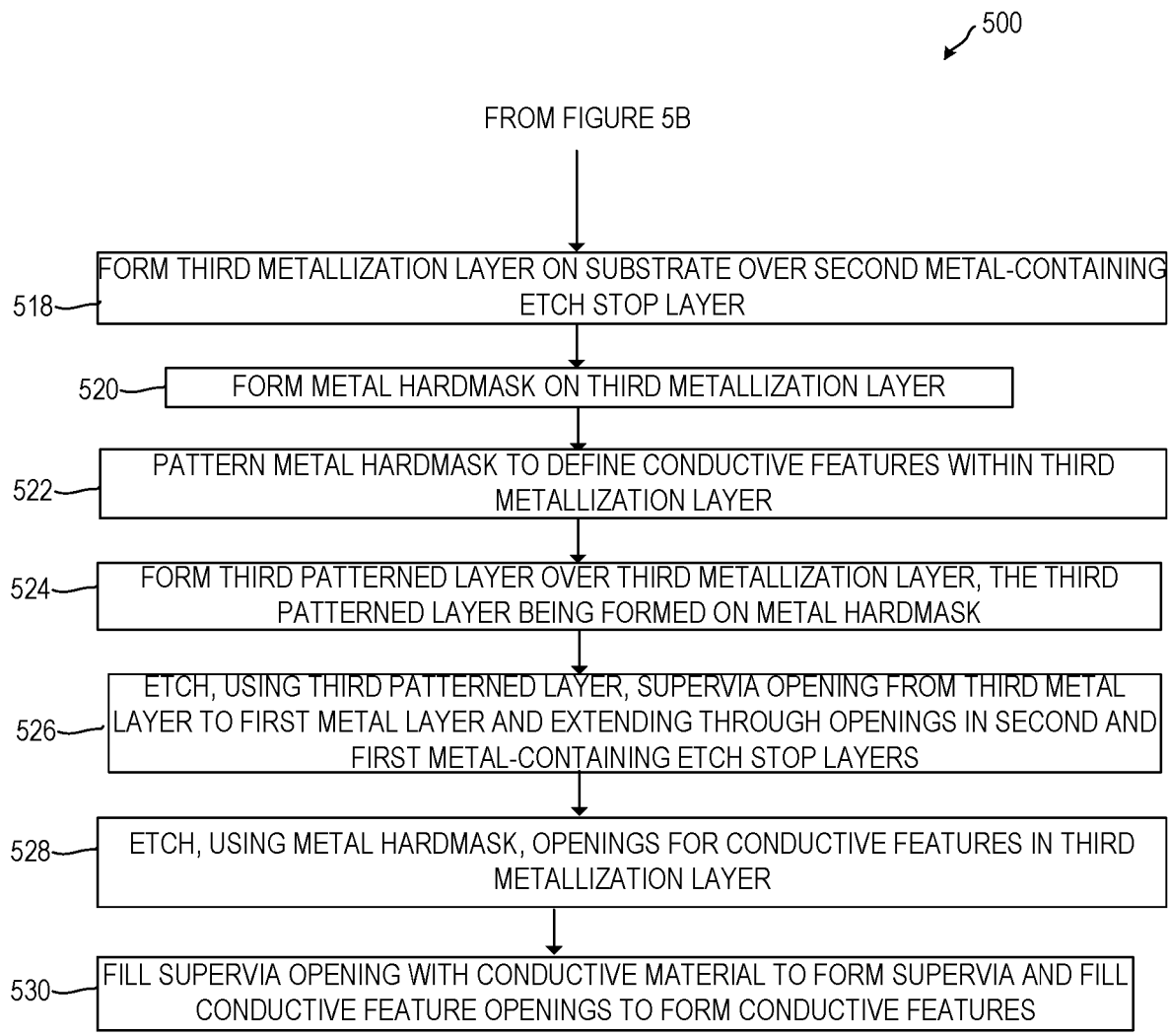

FIGS. 5A-5B illustrate an example method of for forming vias in the semiconductor device, according to certain embodiments of this disclosure. Although method 500 forms a supervia 140 that connects an Mx layer to an Mx+2 layer, this disclosure contemplates method 500 incorporating additional layers for a supervia, if desired. Although method 500 is described with reference to forming a single supervia 140, one of skill in the art will understand that additional supervias could be formed, potentially simultaneously, using or as a part of the same process.

As shown in FIG. 5A, at step 502, a first metallization layer 104*a* is formed on a substrate 102. First metallization layer 104*a* includes a first metal feature (conductive feature 106) and dielectric material 108. In certain embodiments, first metallization layer 104*a* is a lowest metallization layer above a device layer. In certain embodiments, in addition to at least a portion of supervia 140 (to be formed at a later stage), first metallization layer 104*a* includes at least one conductive feature 106, the at least one conductive feature 106 being a conductive line, a conductive contact, or a conductive via.

At step 504, an etch stop layer 110*a* is formed on first metallization layer 104*a*. In certain embodiments, etch stop layer 110*a* contains metal. Etch stop layer 110*a* may be formed of a non-metal material (e.g., SiCN or SiN) or a metal-containing material (e.g., AlO or AlN), or another suitable material. At step 506, a first patterned layer 112*a* is formed over etch stop layer 110*a*. At step 508, using first patterned layer 112*a*, opening 126*a* is formed in etch stop layer 110*a*. In certain embodiments, forming, using first patterned layer 112*a*, opening 126*a* in etch stop layer 110*a* includes performing a wet etch process, a dry etch process, or a combination of a wet etch process and a dry etch process.

At step 510, a second metallization layer 104*b* is formed on substrate 102 over etch stop layer 110*a*. In certain embodiments, in addition to at least a portion of supervia 140 (to be formed at a later stage), second metallization layer 104*b* includes at least one conductive feature 106, the at least one conductive feature 106 being a conductive line, a conductive contact, or a conductive via.

At step 512, an etch stop layer 110*b* is formed on second metallization layer 104*b*. In certain embodiments, etch stop layer 110*b* contains metal. Etch stop layer 110*b* may be formed of a non-metal material (e.g., SiCN or SiN) or a metal-containing material (e.g., AlO or AlN), or another suitable material. In certain embodiments, etch stop layer 110*b* is made of the same material as etch stop layer 110*a*. At step 514, a second patterned layer 112*b* is formed over etch stop layer 110*b*. At step 516, using second patterned layer 112*b*, opening 126*b* is formed in etch stop layer 110*b*. In certain embodiments, forming, using second patterned layer 112*b*, opening 126*b* in etch stop layer 110*b* includes performing a wet etch process, a dry etch process, or a combination of a wet etch process and a dry etch process.

Turning to FIG. 5B, at step 518, a third metallization layer 104*c* is formed on substrate 102 over etch stop layer 110*b*. In certain embodiments, first metallization layer 104*a* is an Mx layer and third metallization layer is an Mx+y layer, where x≥0 and y≥2. At step 520, hardmask 130 is formed on third metallization layer 104*c*. Although hardmask 130 may be made of any suitable material, in certain embodiments, hardmask 130 is a metal hardmask. At step 522, hardmask 130 is patterned for defining openings 138 for conductive features 106 (e.g., lines, contacts, and/or vias) within third metallization layer 104*c*. In certain embodiments in which hardmask 130 is not used, other processing may be performed in place of steps 520 and 522 or method 500 may proceed from step 518 to step 524.

At step 524, a third patterned layer 112*c* is formed over third metallization layer 104*c*. In certain embodiments, third patterned layer 112*c* is a supervia mask for forming a supervia opening for a supervia in a subsequent step. In embodiments in which hardmask 130 is formed and patterned at steps 520 and 522, third patterned layer 112*c* may be formed over hardmask 130.

At step 526, using third patterned layer 112c, supervia opening 136 is etched from third metallization layer 104c to first metallization layer 104a. In certain embodiments, etching, using third patterned layer 112c, supervia opening 136 from third metallization layer 104c to first metallization layer 104a includes performing a wet etch process, a dry etch process, or a combination of a wet etch process and a dry etch process. Supervia opening 136 may extend through opening 126b in etch stop layer 110b and opening 126a in etch stop layer 110a. In certain embodiments, opening 126a etch stop layer 110a, opening 126b in etch stop layer 110b, and opening 114c in third patterned layer 112c are at least partially vertically aligned.

At step 528, to the extent hardmask 130 is used to pattern openings 138 in third metallization layer 104c for forming conductive features 106 in third metallization layer 104c, openings 138 in third metallization layer 104c using hardmask 130 as an etch mask.

At step 530, supervia opening 136 is filled with a conductive material to form supervia 140 and, to the extent applicable, openings 138 in third metallization layer 104c may be filled with conductive material to form conductive features 106 in third metallization layer 104c. In certain embodiments, opening 126a in etch stop layer 110a is at a base portion of supervia opening 136, and supervia 140 is at least partially misaligned with conductive feature 106 of first metallization layer 104a to which supervia 140 is coupled (e.g., conductive feature 106i). In certain embodiments, an upper portion 142 of supervia 140 also may form at least a portion of a conductive feature (e.g., in addition to being part of or conductively coupled to supervia 140) of third metallization layer 104c, such as a conductive line or a conductive contact, for example.

Although method 500 is described for forming a semiconductor device 100 that includes first metallization layer 104a, second metallization layer 104b, and third metallization layer 104c, with supervia 140 coupling metallization layer 104c to metallization layer 104a, it will be understood that method 500 (as well as method 400) could be used to form a semiconductor device with additional metallization layers 104, and that, if desired, supervia 140 can be formed across more than three metallization layers 104. As just one example, prior to forming third metallization layer 104c on substrate 102 over etch stop layer 110b, method 500 (or method 400) may include forming a fourth metallization layer 104 on substrate 102 over etch stop layer 110b, forming an etch stop layer no on the fourth metallization layer 104, forming, using a fourth patterned layer 112, an opening 126 in the etch stop layer formed on the fourth metallization layer 104. In this example, third metallization layer 104c may be formed on substrate 102 over etch stop layer 110b and the etch stop layer no formed on the fourth metallization layer 104. Additionally, in this example, supervia opening 136 may extend through opening 126 in the etch stop layer formed on the fourth metallization layer 104.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

"Substrate" or "target substrate" as used herein generically refers to an object being processed in accordance with this disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Although this disclosure describes or illustrates particular process/method steps as occurring in a particular order, this disclosure contemplates the process/method steps occurring in any suitable order. Moreover, this disclosure contemplates the process/method steps being repeated one or more times in any suitable order. Although this disclosure describes or illustrates particular process/method steps as occurring in sequence, this disclosure contemplates the process/method steps occurring at substantially the same time, where appropriate.

Additionally, although each of the different features, techniques, configurations, etc. herein may be described in different places of this disclosure, it is intended that each of the concepts can be executed independently of each other or in combination with each other. Accordingly, this disclosure can be embodied and viewed in many different ways.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of forming a vertical electrical interconnect, the method comprising:
    forming a first metallization layer on a substrate, the first metallization layer having lines of metal running parallel to a working surface of the substrate;
    forming a first metal-containing etch stop layer on the first metallization layer;
    forming openings in the first metal-containing etch stop layer using a first supervia mask, wherein the first supervia mask comprises a first mask opening having a first width;
    forming a second metallization layer on the substrate over the first metal-containing etch stop layer;
    forming a second metal-containing etch stop layer on the second metallization layer;
    forming openings in the second metal-containing etch stop layer using a second supervia mask, wherein the second supervia mask comprises a second mask opening having the first width;
    forming a third metallization layer on the substrate over the second metal-containing etch stop layer;
    forming a third supervia mask over the substrate, wherein the third supervia mask comprises a third mask opening having the first width; and
    etching a supervia opening from the third metallization layer to the first metallization layer using the third supervia mask as an etch mask, wherein the supervia opening exposes the first metal-containing etch stop layer and the second metal-containing etch stop layer, and wherein a second width of the supervia opening at the first metal-containing etch stop layer is less than a third width of the supervia opening at the second metal-containing etch stop layer.

2. The method of claim 1, further comprising filling the supervia opening with a conductive material to form a supervia.

3. The method of claim 1, wherein the first metal-containing etch stop layer and the second metal-containing etch stop layer each comprises aluminum oxide or aluminum nitride.

4. The method of claim 1, further comprising, prior to forming the third supervia mask over the substrate:
forming a metal hardmask on the third metallization layer; and
patterning the metal hardmask to define openings for conductive features within the third metallization layer, the third supervia mask being formed on the metal hardmask.

5. A method, comprising:
forming a first metallization layer on a substrate, the first metallization layer comprising a first metal feature and dielectric material;
forming a first metal-containing etch stop layer on the first metallization layer;
forming, using a first patterned layer, an opening in the first metal-containing etch stop layer, wherein the first patterned layer comprises a first plurality of layers;
forming a second metallization layer on the substrate over the first metal-containing etch stop layer;
forming a second metal-containing etch stop layer on the second metallization layer;
forming, using a second patterned layer, an opening in the second metal-containing etch stop layer, wherein the second patterned layer comprises a second plurality of layers;
forming a third metallization layer on the substrate over the second metal-containing etch stop layer; and
etching, using a third patterned layer, a supervia opening from the third metallization layer to the first metallization layer, the supervia opening extending through the opening in the second metal-containing etch stop layer and the opening in the first metal-containing etch stop layer, wherein the third patterned layer comprises a third plurality of layers, wherein the supervia opening exposes the first metal-containing etch stop layer and the second metal-containing etch stop layer, and wherein a width of the supervia opening decreases as the supervia opening extends from the second metal-containing etch stop layer to the first metal-containing etch stop layer.

6. The method of claim 5, further comprising filling the supervia opening with a conductive material to form a supervia.

7. The method of claim 6, wherein, in addition to at least a portion of the supervia, the first metallization layer and the second metallization layer each include at least one respective conductive feature, the at least one respective conductive feature being a conductive line, a conductive contact, or a conductive via.

8. The method of claim 6, wherein an upper portion of the supervia forms at least a portion of a conductive feature of the third metallization layer.

9. The method of claim 6, wherein the opening in the first metal-containing etch stop layer is at a base portion of the supervia opening, the supervia being at least partially misaligned with a conductive feature of the first metallization layer to which the supervia is coupled.

10. The method of claim 5, wherein the opening in the first metal-containing etch stop layer, the opening in the second metal-containing etch stop layer, and an opening in the third patterned layer are at least partially vertically aligned.

11. The method of claim 5, wherein the first metal-containing etch stop layer and the second metal-containing etch stop layer each comprises aluminum oxide or aluminum nitride.

12. The method of claim 5, wherein the first metallization layer is a lowest metallization layer above a device layer.

13. The method of claim 5, wherein the first metallization layer is an Mx layer and the third metallization layer is an Mx+y layer, where $x \geq 0$ and $y \geq 2$.

14. The method of claim 5, wherein:
forming, using the first patterned layer, the opening in the first metal-containing etch stop layer comprises performing a wet etch process, a dry etch process, or a combination of a wet etch process and a dry etch process;
forming, using the second patterned layer, the opening in the second metal-containing etch stop layer comprises performing a wet etch process, a dry etch process, or a combination of a wet etch process and a dry etch process; and
etching, using the third patterned layer, the supervia opening from the third metallization layer to the first metallization layer comprises performing a wet etch process, a dry etch process, or a combination of a wet etch process and a dry etch process.

15. The method of claim 5, wherein:
the method further comprises, prior to forming the third metallization layer on the substrate over the second metal-containing etch stop layer:
forming a fourth metallization layer on the substrate over the second metal-containing etch stop layer;
forming a third metal-containing etch stop layer on the fourth metallization layer;
forming, using a fourth patterned layer, an opening in the third metal-containing etch stop layer;
the third metallization layer is formed on the substrate over the second metal-containing etch stop layer and the fourth metal-containing etch stop layer; and
the supervia opening further extends through the opening in the third metal-containing etch stop layer.

16. A method, comprising:
forming a first etch stop layer on a first metallization layer of a semiconductor substrate;
forming, prior to forming a second metallization layer over the first metallization layer, an opening in the first etch stop layer according to a first supervia mask, wherein the first supervia mask has a first mask opening;
forming the second metallization layer over the first metallization layer;
forming a second etch stop layer on the second metallization layer;
forming, prior to forming a third metallization layer over the second metallization layer, an opening in the second etch stop layer according to a second supervia mask, wherein the second supervia mask has a second mask opening;

forming the third metallization layer over the second metallization layer; and etching a supervia opening from the third metallization layer to the first metallization layer according to a third supervia mask, wherein the third supervia mask has a third mask opening, wherein the first mask opening, the second mask opening and the third mask opening have a same width, wherein the supervia opening exposes the first etch stop layer and the second etch stop layer, and wherein a width of the supervia opening decreases as the supervia opening extends from the second etch stop layer to the first etch stop layer.

17. The method of claim 16, further comprising filling the supervia opening with a conductive material to form a supervia.

18. The method of claim 16, wherein the opening in the first etch stop layer, the opening in the second etch stop layer, and the third mask opening in the third supervia mask are at least partially vertically aligned.

19. The method of claim 16, wherein the first etch stop layer and the second etch stop layer each comprises aluminum oxide or aluminum nitride.

20. The method of claim 16, wherein:

forming, using the first supervia mask, the opening in the first etch stop layer comprises performing a wet etch process, a dry etch process, or a combination of a wet etch process and a dry etch process; and forming, using the second supervia mask, the opening in the second etch stop layer comprises performing a wet etch process, a dry etch process, or a combination of a wet etch process and a dry etch process.

\* \* \* \* \*